United States Patent
Boyer et al.

[19]

[11] Patent Number: 6,167,484
[45] Date of Patent: Dec. 26, 2000

[54] METHOD AND APPARATUS FOR LEVERAGING HISTORY BITS TO OPTIMIZE MEMORY REFRESH PERFORMANCE

[75] Inventors: John Mark Boyer; William Clayton Bruce, Jr.; Grady Lawrence Giles; Thomas K. Johnston; Bernard J. Pappert; John J. Vaglica, all of Austin, Tex.

[73] Assignee: Motorola, Inc., Schaumburg, Ill.

[21] Appl. No.: 09/076,149

[22] Filed: May 12, 1998

[51] Int. Cl.[7] ....................................... G11C 7/00
[52] U.S. Cl. ........................... 711/106; 713/324; 365/222
[58] Field of Search ............................. 713/324; 711/106; 365/222

[56] References Cited

U.S. PATENT DOCUMENTS 5,875,143   2/1999   Ben-Zvi .................................. 365/222

OTHER PUBLICATIONS

Nitta et al., "SP23.5: A 1.6GB/s Data Rate 1Gb–Synchronous DRAM with Hierarchical Square–Shaped Memory Block and Distributed Bank Architecture," ISSCC96/Session 23/DRAM/Paper SP23.5, pp. 376–377 & 477.

Yoo et al., "SP23.6: A 32–Bank 1Gb DRAM with 1GB/s Bandwidth," ISSCC96/Session 23/DRAM/Paper SP23.6, pp. 378–379 and 477.

Itoh et al., "Trends in Low–Power RAM Circuit Technologies," 1994 IEEE Symposium on Low Power Electronics, pp. 84–87.

"Literature Survey and Analysis of Low–Power Techniques for Memory and Microprocessors," Bower; Web site: http//infopad.eecs.berkeley.edu/~bhowers/project2.html.

"A 1.6GB/s Data–Rate 1Gb Synchronous DRAM with Hierarchical Square–Shaped Memory Block and Distributed Bank Architecture," Nitta, et al; ISSCC96/Session 23/DRAM/Paper SP23.5.

"Trends in Low–Power RAM Circuit Technologies," Itoh, et al; Proceedings of the IEEE, vol. 83, No. 4, Apr. 1995.

"A 32–Bank 1Gb DRAM with 1GB/s Bandwidth," Yoo, et al.; ISSCC96/Session 23/DRAM/Paper SP 23.6.

*Primary Examiner*—David L. Robertson

[57] ABSTRACT

A method and apparatus that improves either power savings and/or DRAM system access bandwidth in an embedded DRAM device. The apparatus (200, 800, or 900) contains embedded DRAM memory devices (212, 802, or 902) which require refresh operations in order to retain data. As the memory devices (212, 802, or 902) are accessed by read and write system operations and by refresh operations, a set of history bits (204, 808, 904) are continually updated to indicate a level of freshness for the charge stored in various DRAM memory rows. When scheduled refresh opportunities arrive for each memory row in the embedded DRAM devices, the history bits (204, 808, 904) are accessed to determine if the refresh operation of a row of memory should be performed or if the refresh operation should be postponed until a subsequent refresh time period.

31 Claims, 11 Drawing Sheets

FIG. 12

|  | 1031 NH CH PQ | 1032 NH CH PQ |  |
|---|---|---|---|
| 0 | 1 1 0 | 0 1 0 | |
|   | 0 1 0 | 0 0 1 | |
|   | 0 1 0 | 0 0 0 | |
| 3 | 1 1 0 | 0 1 0 | |
| 4 | 0 1 0 | 0 0 0 | |
|   | 0 1 0 | 0 0 0 | |
|   | 0 1 0 | 0 0 0 | |
| 7 | 0 1 0 | 0 0 0 | |
| 8 | 1 1 0 | 0 1 0 | |
|   | 1 1 0 | 0 1 0 | |
|   | 0 1 0 | 0 0 0 | |
| 11| 1 1 0 | 0 1 0 | |
| 12| 0 1 0 | 0 0 0 | |
|   | 0 1 0 | 0 0 0 | |
|   | 1 1 0 | 0 1 0 | |
| 15| 0 1 0 | 0 0 0 | |
|   | AFTER CROT 18c | UPDATE BEFORE MROC d | |

METHOD AND APPARATUS FOR LEVERAGING HISTORY BITS TO OPTIMIZE MEMORY REFRESH PERFORMANCE

FIELD OF THE INVENTION

The present invention relates generally to integrated circuit (IC) operation, and more particularly, to using history bits to optimize DRAM memory refresh operations in an IC containing embedded DRAM memory.

BACKGROUND OF THE INVENTION

The integrated circuit (IC) industry is currently seeking ways to integrate logic circuits, such as a central processing unit (CPU) or microcontroller (MCU), and dynamic random access memory (DRAM) onto the same substrate. These CPU-DRAM integrated devices are being generally referred to as embedded DRAM microcontrollers. As is known in the art, current CPU/logic integrated circuit processes are optimized for circuit speed and metallic interconnect efficiency. These logic IC processes typically form current-leaky transistors. On the other hand, as is also known in the art, modern discrete DRAM IC processes used to manufacture state-of-the-art 16 Mbit and 64 Mbit DRAMs use a totally different process than a CPU logic process. Modern discrete DRAM processes are optimized for data retention whereby leakage current is reduced. DRAM processes result in the formation of very few metallic layers whereby speed and routing may be compromised to obtain better data retention. In essence, the transistors in a DRAM process are typically orders of magnitude less current leaky than the transistors of a logic/CPU process.

Due to these differences between a CPU logic process and a discrete DRAM process, integration of both logic and DRAM onto a single integrated circuit is not an easy task. It is clear that the combination of logic devices and DRAM memory devices on the same integrated circuit substrate must either compromise speed performance and signal routing capabilities in the CPU or compromise the data retention times of DRAM cells. It is believed that the latter may be the least problematic of the two choices. In this case, the CPU and DRAM are fabricated from the same logic IC process. When using this logic process, the data retention time for the embedded DRAM will be roughly two orders of magnitude less than the retention time of modern discrete DRAM devices (e.g., 16 Mbit and 64 Mbit devices now being shipped). By way of example, a discrete 16 Mbit or 64 Mbit DRAM that is currently manufactured using today's technology contains DRAM cells that have a data retention time of roughly tens of milliseconds. However, an embedded DRAM device manufactured using a logic process will typically have a data retention time of roughly 100 microseconds at maximum temperature, which is significantly reduced from the tens of milliseconds obtainable in discrete DRAM devices. This reduced data retention time is problematic as discussed below.

A DRAM relies upon capacitive charge for bit storage. This capacitive charge will adversely dissipate over a time known as the data retention time. To avoid loss of data due to dissipated charge, the capacitive charge of each DRAM cell must be refreshed within a specific time interval less than the data retention time. Due to the two order of magnitude reduction in data retention time for the embedded DRAM memory cells made by a logic/CPU process, refresh operations would need to be performed more frequently in embedded devices whereby operational bandwidth for functional read/write DRAM accesses will be reduced. In addition, the more frequent refresh cycles and faster dissipation of charge will most likely increase the power consumed by the embedded device.

The effect on DRAM access bandwidth, given the two orders of magnitude of reduction in DRAM retention for embedded devices, can be illustrated by numerical example. In this example, assume an embedded device with a 25 MHz clock, wherein the embedded DRAM uses a CAS-before-RAS (CBR) refresh technique which requires two clock periods per refresh operation in a burst mode. Also assume that refresh operations are controlled by clock edges generated from an on-chip DRAM refresh control circuit. Further assume, as is very common, that embedded DRAM arrays are smaller than discrete DRAM arrays whereby 128 embedded row addresses need to be generated to perform a complete array refresh whereas 2048 row addresses need to be generated to fully refresh a discrete DRAM device. Due to the two orders of magnitude difference between retention times, it is expected that DRAM cells in an embedded device need to be refreshed every 100 microseconds whereas discrete DRAM cells only need be refreshed every 20,000 microseconds. Given the above typical values, the time to refresh the entire embedded DRAM array is equal to two clock periods times the 40 nanosecond clock period times 128 memory rows which equals 10.24 microseconds. However, the time to refresh a discrete DRAM is equal to the two clock periods multiplied by a 40 nanosecond clock period multiplied by 2048 rows which equals 163.84 microseconds.

Using the above calculated times, the bandwidth consumed by refresh operations for the embedded DRAM device is 10.24 microseconds divided by the 100 microsecond refresh period which is roughly 10 percent. This means that 10% of the DRAM access bandwidth is consumed in an embedded device to keep the stored data fresh. The discrete DRAM bandwidth consumption is equal to 163 microseconds divided by the 20,000 microsecond refresh period which is roughly 0.8% bandwidth consumption. Therefore, an embedded DRAM device could consume 10 times more system access operational bandwidth than a discrete DRAM device. It should now be clear that timely performance and/or intelligently performing DRAM refreshes in embedded DRAMs becomes a serious concern whereas discrete DRAM devices are not concerned with improving refresh consumption of bandwidth since the bandwidth consumed in discrete DRAMs is insignificant.

In summary, embedded DRAM devices need to be refreshed more often than discrete DRAM devices whereby additional power is typically consumed and embedded DRAM device refresh operations typically consume a larger percentage of the operational bandwidth of the DRAM devices. Since a larger portion of the DRAM bandwidth is consumed, the embedded DRAM array is available for fewer read and write accesses whereby system performance may be degraded. Due to this result, system designers must attempt to perform refresh operations in a more intelligent manner whereby power can be conserved and more operational bandwidth can be returned to a logic circuit, that may include a CPU, integrated with an embedded DRAM array.

Discrete DRAM refresh operations, as are known in the art, are not intelligent refresh operations and do not need to be intelligent since the operational impairment and power consumption of refresh operations in a discrete DRAMs are generally not thought to be of big concern. In other words, since the bandwidth consumed by refresh operations in a discreet DRAM is less than 1% of the total bandwidth, there is little to be gained in complicating the design of a discrete DRAM device to perform intelligent refresh operations. However, intelligent refreshing of an embedded DRAM can significantly reduce the 10% DRAM refresh overhead bandwidth which justifies the added intelligent circuitry. The following paragraphs are a discussion of the common methods of refresh used in discrete DRAMs and these methods are shown herein to be inadequate to achieve the intelligent refreshing needed in embedded devices.

The discrete DRAMs may either perform a full sweep burst refresh, whereby all memory locations are refreshed sequentially in an uninterrupted manner in a single block of time, or perform distributed burst refreshes whereby subportions of the DRAM memory array are refreshed at different times that are spread out across an operational system access bandwidth of the DRAM. A refresh timer in a DRAM controller typically provides a time out signal which determines when a sweep burst or a distributed burst is to occur. The refresh operation will occur, in response to the time out signal, at those selected DRAM memory rows regardless of whether or not refresh is actually needed in these selected DRAM memory rows. Therefore, with unintelligent refresh operations in discrete DRAM, a row of memory that does not need refreshing (due to a previously performed write or read operation to this row) will be refreshed anyway thereby wasting some power and wasting operational DRAM bandwidth. In the discrete DRAMs, refreshes are performed with no intelligent processing of the access history or operational states of the memory rows. While the added power and reduced bandwidth is not a problem for discrete DRAMs as shown above, this added power and lost bandwidth would be severely degrading to the performance of an embedded DRAM device.

Discrete DRAM suppliers provide three standard methods for accomplishing non-intelligent refresh. One method is known as the row-address-strobe only (RAS-only) method, a second is referred to as the column-address-strobe (CAS) before row-address-strobe (RAS) method or CBR, and a third methodology is referred to as hidden refresh.

In the RAS-only scheme, a row address is provided by the DRAM controller where RAS is asserted but CAS remains deasserted. This operation results in all of the memory cells in the selected row being read out of the memory array and refreshed by a write-back operation which is built into the sense amplifiers of the DRAM device. The RAS-only refreshes are automatically performed through the DRAM array in an iterative and circular manner whereby a row is refreshed when scheduled, regardless of whether the charge in the row needs a refresh or not.

In the second scheme, the CBR scheme, the controller generates a CAS-before-RAS cycle and the DRAM utilizes an internal refresh row address generator to put the next refresh address onto the row address lines to the memory array. The row(s) associated with the row address is thereby refreshed within the DRAM array. This scheme uses the controller to generate control signals, but obviates the need for the DRAM controller to provide the row address and provides a method to refresh multiple rows in a memory comprised of multiple memory arrays. Both the RAS-only and the CAS before RAS (CBR) refresh methods are non-intelligent schemes which could waste power and consume significant bandwidth if these discrete DRAM methodologies were simply duplicated in an embedded DRAM environment without intelligent history control.

In the hidden refresh methodology, a CBR refresh cycle is appended to a system access where a system access is a read or write operation to a DRAM location. By keeping CAS low, providing a new row address internally, and toggling the RAS signal, a CBR refresh cycle is executed while the output data for a read is held. The refresh cycle time is not available to the user but the operation is hidden by the data being held valid at an output of the DRAM. Therefore, the "hidden" aspect of this technique refers to the data, and not the refresh time, where the refresh time is still lost to the system when using this technique. Therefore, if hidden refresh methodology is used in embedded DRAMs, it could also significantly consume bandwidth and cause considerable power consumption problems in microcontroller embedded DRAM designs as discussed above.

Therefore, a need exists in the industry for a more intelligent manner of scheduling refresh operations whereby: (1) greater system access bandwidth can be provided by an embedded DRAM device so that more performance can be achieved; and/or (2) less power is consumed by refresh operations internal to the embedded DRAM integrated circuit.

BRIEF DESCRIPTION OF THE DRAWINGS

FIGS. 10–13 illustrate, in a time sequential state diagram, the logical state of history bits over time within the system of FIG. 9 in accordance with the present invention.

FIG. 14 illustrates, in a timing diagram, the relationship between data retention time (DRT), memory refresh opportunity cycle (MROC), and cluster refresh opportunity times (CROT) for a distributed refresh burst architecture in accordance with the present invention.

Figure 1:
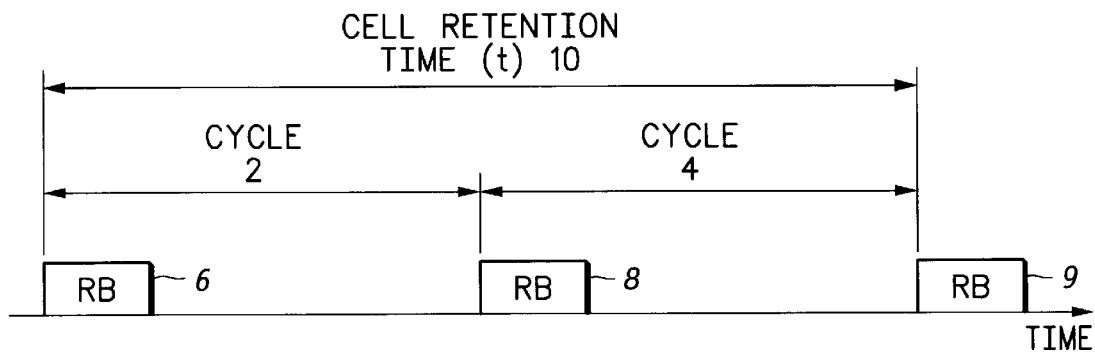
FIG. 1 illustrates, in a timing diagram, the relationship between the frequency of refresh burst opportunity cycles and Dynamic Random Access Memory (DRAM) cell retention time in accordance with the present invention.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DESCRIPTION OF A PREFERRED EMBODIMENT

Generally, the present invention is a method and apparatus for reducing the power consumed by DRAM refresh operations and/or improving the system access (i.e., read/write) operational bandwidth of an embedded DRAM. These advantages are obtained by retaining history information for each memory row or refresh group of memory cells within the embedded DRAM array. When time comes to refresh a refresh group or a memory row, this history information is processed whereby refreshing is not performed on a row of cells that do not need refreshing (i.e., rows that are inactive, or rows that were recently read or written since these accesses inherently do a refresh of the rows). In one embodiment, time that is not used refreshing, for whatever reason, is given back to the CPU/system to improve system access bandwidth to the DRAM. In another embodiment, the reduced number of refreshes will reduce power consumed by the embedded memory which is an advantage in any microcontroller solution. A significant portion of the roughly 10% refresh bandwidth consumed by embedded DRAM may be returned to the system by the algorithms and systems taught herein.

The invention can be further understood with reference to FIGS. 1–16.

FIG. 1 illustrates a timing diagram of the relationship between full-array refresh bursts and Dynamic Random Access Memory (DRAM) cell retention time. In particular, cell retention time 10 represents how long an embedded DRAM cell is guaranteed to store charge without being refreshed. For example, once a cell is written with a charge indicating a logic 1 or a logic 0, the cell will retain the stored charge for a cell retention time, allowing a sense amplifier coupled to the cell to be able to resolve whether a one or zero is present. If the cell is written with charge and not refreshed before expiration of the cell retention time, the charge in the capacitor of the DRAM will most likely have decayed to the extent that the sense amplifier cannot accurately determine what logic value was previously stored in the cell (i.e., data has been lost through passage of time coupled with capacitor charge leakage).

In accordance with the present invention, at least two Memory Refresh Opportunity Cycles (MROC) 2 and 4 exist within the time span of the cell's retention time. While any number of MROCs, such as 3, 4, 10, 100, etc., may be positioned within one retention time period 10, two MROCs are sufficient to provide some useful improvement in embedded DRAM refreshing while providing minimal overhead and complexity. For each MROC added to the two MROCs illustrated in FIG. 1 a point of diminishing marginal returns becomes more evident due to increasing circuit cost and diminishing bandwidth and/or power savings. For this reason, the examples given herein assume that two MROCs are used whereby it should be clear that any number of MROCs may be incorporated into the design.

MROCs 2 and 4 each represent a time period during which each memory cell in a memory array has the opportunity to be refreshed. A specific memory cell will be refreshed within an MROC only if the refresh is needed to guarantee data retention until the next MROC occurs. Within MROC 2 and 4, refresh opportunity times or refresh bursts (RB) 6 and 8 respectively reside. Although FIG. 1 illustrates a full sweep burst refresh methodology where the entire memory array is processed for refreshing in one uninterrupted time period per cycle 2 or 4, the process and apparatus taught herein may easily use a distributed refresh approach. In a distributed approach, the RBs 6 and 8 will be divided into fractional sub-periods where these periods will be distributed throughout their respective cycles 2 and 4 similar to that shown in FIG. 5. When using the burst or distributed approach, RB 6 represents the time allocated by a DRAM controller for optionally refreshing the DRAM cells within cycle 2, and RB 8 represents the time allocated by a DRAM controller for optionally refreshing all the DRAM cells within cycle 4. If a memory cell is refreshed in MROC 2, it is not necessary to refresh the same cell in MROC 4 since it is within the cell retention time 10, and so on. RB 9 is used to indicate that the cycles 2 and 4 containing the RBs 6 and 8 are repeated iteratively over time as long as needed to maintain data in the DRAM cells.

Figure 2:
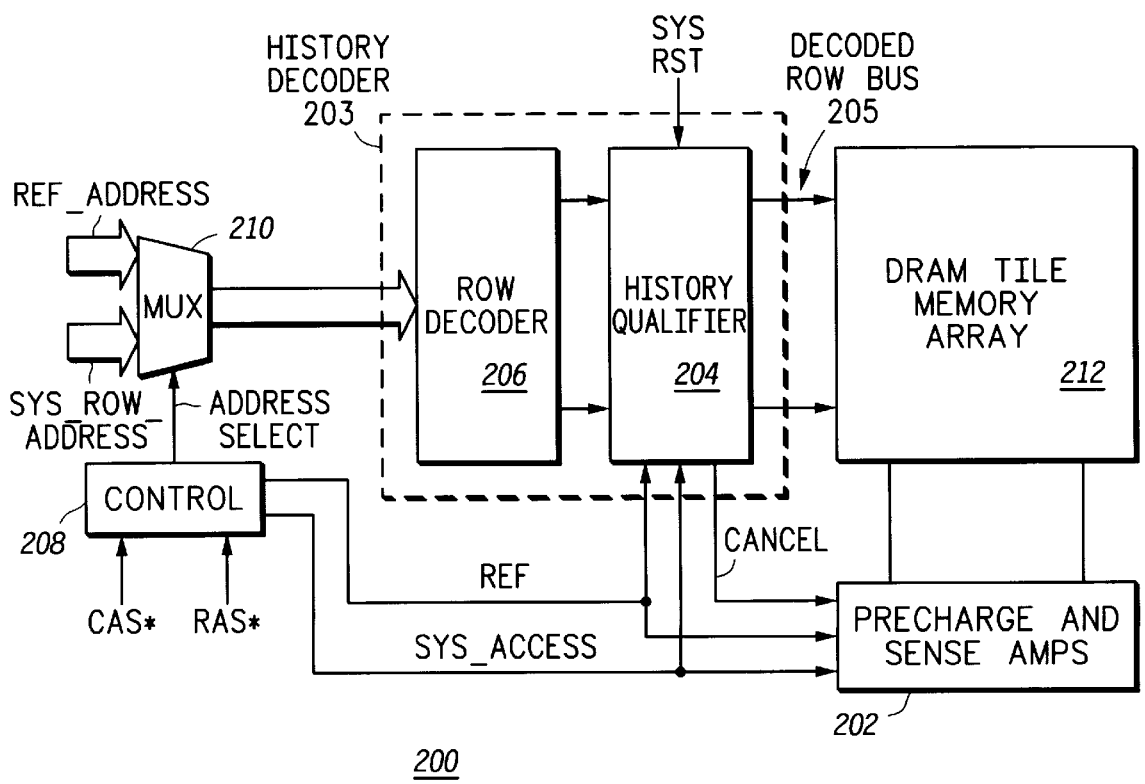
FIG. 2 illustrates, in a block diagram, a memory system using refresh history in accordance with the present invention.

FIG. 2 illustrates a block diagram of a DRAM memory system 200 for optimizing refreshes of DRAM memory cells to save power in accordance with the present invention. The system 200 of FIG. 2 comprises a memory array 212, precharge circuitry and sense amplifiers 202, history decoder 203, control block 208, and multiplexor (MUX) 210. In operation, the MUX 210 receives, at a first input data node, a signal labeled REF_ADDRESS which is an address specifying which row in the memory array 212 is to be refreshed. The REF_ADDRESS is provided from a DRAM controller (not shown in FIG. 2 but shown in FIG. 8). The multiplexor 210 of FIG. 2 also receives, at a second input data node, a signal labeled SYS_ROW_ADDRESS. The SYS_ROW_ADDRESS is used to identify a row of the memory array 212 which is to be accessed by a system access, such as a data write to memory or a data read from memory. In response to RAS and CAS signals received by the control block 208, the multiplexor 210 provides a signal labeled ADDRESS to a data output node. The value of either REF_ADDRESS or SYS_ROW_ADDRESS is provided on the ADDRESS signal, based upon an ADDRESS SELECT control signal received at an input control node from the control block 208. If a refresh cycle is occurring, the REF_ADDRESS is provided as the output of MUX 210, if a normal system access (e.g., read or write) is occurring, then the SYS_ROW_ADDRESS is provided as the output of the MUX 210.

The control block 208 provides the ADDRESS SELECT signal at an output node of block 208. Whether the ADDRESS SELECT signal specifies the refresh address REF_ADDRESS or the system address SYS_ROW_ADDRESS for use depends upon the signals labeled CAS* and RAS*. The CAS* and RAS* signals are active low column address strobe and row address strobe signals received at inputs to the control block 208 as illustrated in FIG. 2. The CAS* and RAS* signals are provided by a memory controller (not shown in FIG. 2) which controls all accesses to the array 212. In other embodiments of the present invention, select signals other than RAS* and CAS* may be received by the controller 208 to select an individual memory array when multiple arrays or memory tiles are used. In the present embodiment, a single memory array or tile 212 is illustrated but one or more tiles each having the associated circuitry of FIG. 2 is assumed to exist. In such cases that employ more than a single tile, a CBR refresh is assumed to refresh an identical row address in each tile. The set of rows refreshed by a single CBR refresh operation comprise a refresh group. The history decoder 203 has input nodes for receiving from the controller 208 a refresh signal (REF) and a system access signal (SYS_ACCESS). When signal REF is active, the history decoder 203 provides an appropriate value on the decoded row bus 205 and control signals to identify the one row, or refresh group to be refreshed at a common time, if refresh is needed according to history bits 302. These asserted signals, in response to proper states in history bits, operate to refresh the selected row, refresh group, or rows of memory in array 212. When the SYS_ACCESS signal is active to perform a normal system access within array 212, the history decoder 203 provides a one-hot value on the decoded row bus 205 which initiates either a conventional system data read or write within the memory array 212. History bits need not be queried for a read or write, but the read or write will result in the history bits being updated since the read or write may affect whether or not the row(s) accessed need a refresh in the next MROC.

When an active refresh signal (REF) is received from the control logic 208, the history decoder 203 controls which row or refresh group of memory array 212 needs to be enabled for refresh operations. In the event that a row or refresh group of memory 212 is to be refreshed, the history decoder 203 will provide an active one-hot row line signal on the decoded row bus 205 to indicate to the array 212 which memory row is to be refreshed. This active row line in conjunction with the precharge and sense amplifier portion 202 control the actual refresh cycle within the array 212 to ensure that data is not lost over time.

When, during a refresh cycle, the history decode block 203 determines that the requested refresh should not occur, no active signal is provided on to the decoded row bus 205, and the history decoder 203 provides an active high CANCEL signal from an output node of the decoder 203. This CANCEL signal is received and processed by the precharge and sense amplifier portion 202. The canceled refresh cycle results in a power savings in the present embodiment.

In one embodiment, the history decoder 203 comprises a row decoder 206, and a history qualifier 204. The row decoder 206 performs a traditional decode operation to select a row to be refreshed or accessed where refreshing is done in a round robin or circular manner through the rows of memory in the DRAM array 212. During normal operation, the history qualifier 204 stores history bits 302 which keep track of the "freshness" of each memory row. Reads and writes, as well as past refresh history, will affect the history bits. In addition, unwritten memory, which may be a large portion of memory in some microcontroller applications, may be flagged as unused so that unused memory is not needlessly refreshed.

When refreshing, the history bits are queried to determine if a particular row refresh is needed or the row can be skipped in this particular memory refresh opportunity cycle (MROC) (see FIG. 1 for details of MROCs). During normal system accesses, when the SYS_ACCESS signal is active, the history qualifier 204 provides the row decoder information to the decoded row bus 205 and modifies the history bit accordingly for each memory row so accessed.

Figure 3:
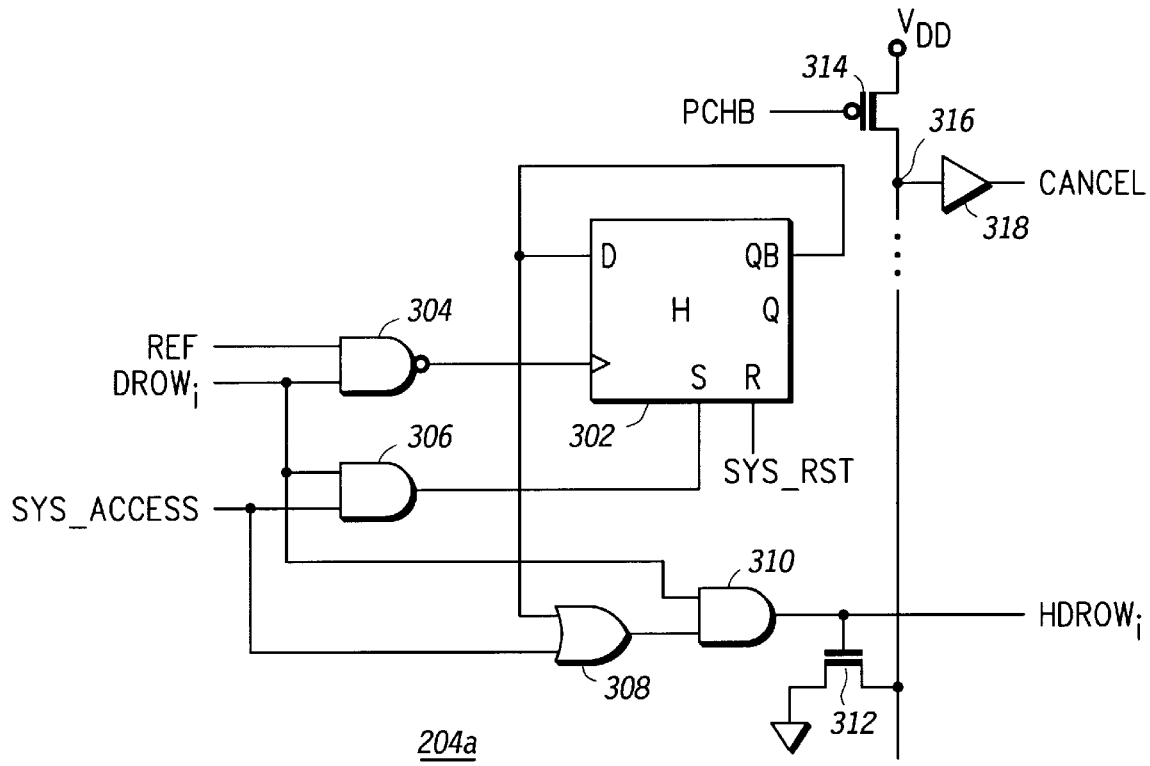
FIG. 3 illustrates, in a circuit diagram, a history bit cell used in FIG. 2 to store DRAM storage freshness information in accordance with the present invention.

FIG. 3 illustrates a specific circuit which depicts the implementation of a history bit in the history qualifier 204 of FIG. 2 for a system incorporating a memory with a single memory array 212. Each row of memory cells in memory array 212 has a single unique history bit similar to the one shown in FIG. 3. For memories having multiple memory arrays 212, each memory row of each memory array will have a unique history bit. Alternatively, each of the memory rows having the same row address in multiple memory arrays (i.e. a refresh group) could have a single unique history bit.

In the following circuit description, the operation is the same for multiple arrays each of which includes the circuitry shown in FIG. 3. The history bit cell 204a of FIG. 3 receives a REF signal, SYS_ACCESS signal, and DROWI signal, where the $DROW_i$ signal is the DRAM row select output from the row decoder 206 which selects memory row i in memory array 212. When a system reset occurs (i.e., SYS_RST=1), the positive edge-triggered D flip-flop 302 of FIG. 3 (labeled as history flip-flop H) is asynchronously reset to logic zero which indicates that the memory row or refresh group associated with circuit 204a is stale. The relationship of the refresh signal, REF, the system access signal, SYS_ACCESS, and individual row select signal, $DROW_i$, for purposes of this discussion is such that REF and SYS_ACCESS cannot both be asserted (i.e., logic one) at the same time, that both are negated before either can become active, and that $DROW_i$ can be asserted only if REF or SYS_ACCESS is asserted.

A system access to the row associated with the specific history bit i will result in both the SYS_ACCESS and $DROW_i$ signals for that one specific history bit i being asserted. When the $DROW_i$ and SYS_ACCESS signals are asserted, the AND gate 306 generates a 1 which asynchronously sets the flip-flop 302 (Q=1 and QB=0) indicating that the row has been recently refreshed by virtue of a system access (read or write). If the DRAM row associated with the cell 204a is refreshed in due course, then REF and $DROW_i$ will be asserted for that history bit i. When REF and $DROW_i$ are both asserted and $DROW_i$ is subsequently negated, the NAND gate 304 output is a negative leading edge pulse which causes flip-flop 302 to toggle to the opposite state on the positive trailing edge of the pulse. Therefore, if the prior state of flip-flop 302 was 0 (i.e., stale) it would be toggled to 1 (i.e., fresh) indicating that it need not be refreshed in the next MROC. If flip-flop 302 was initially a 1 (i.e., fresh), it would be toggled to 0 (i.e., stale) which schedules the row to be refreshed in the next MROC. Because the flip-flop 302 is toggled on the trailing edge of the pulse, the flip-flop changes state only after an operation has been completed.

The decoder portion of 204a consists of an OR gate 308, an AND gate 310, and an n-channel transistor 312. The signal $HDROW_i$ is the wordline i of the DRAM memory array 212. Also shown in FIG. 3 is generation of the history qualifier circuit output signal, CANCEL, which inhibits or enables the sense amplifier in the memory array 212. The CANCEL signal is functionally equivalent to a NOR gate consisting of the single precharge enable p-channel transistor 314, single non-inverting buffer 318, and the plurality of n-channel transistors of which one is shown as transistor 312.

In an alternate low power embodiment, CANCEL is forced low during a system access and node 316 is not discharged. This is accomplished by replacing buffer 318 with a two input AND gate. One input of the AND gate is driven by node 316 and the other AND input is driven by SYS_ACCESS inverted. The ground connection to the N-channel transistor 312 is replaced by a virtual ground connection. The virtual ground is driven by the output of an inverter whose input is either REF or a control signal asserted during the current CROT (e.g. 12, 14, 16, 18 of FIG. 5). Note that the virtual ground is only driven low during a possible refresh time. Power saving is achieved by this implementation since capacitive node 316 does not discharge during system accesses which are typically enabled 90% of the time, for the example described earlier.

Prior to either a system access or a refresh, n-channel transistor 312 is off, the precharge enable signal PCHB is 0 (i.e., active), and the transistor 314 conducts which charges the node 316 to VDD. The precharge enable signal PCHB is then driven to a 1 (i.e., inactive) which turns off transistor 314 leaving node 316 charged to a 1. Each $HDROW_i$ signal has an opportunity to discharge the node 316 through a transistor identical to transistor 312. If no $HDROW_i$ signal is a 1 (i.e., no row is selected), the node 316 remains charged and the output of the non-inverting buffer 318 is a 1 which cancels (i.e., disables) the sense amplifiers from sensing the bit lines thus avoiding a refresh cycle with a needless dissipation of power. If $HDROW_i$ is a 1 then the node 316 is discharged to ground and the CANCEL output of buffer 318 is a 0 which enables the sense amplifiers to sense the bit lines.

If a system read or write access is generated, then SYS_ACCESS is a 1 and the AND gate 310 output, $HDROW_1$, is a 1 which connects the row of memory cells in memory array 212 to the bit lines and enables the sense amplifiers to become active to sense the bit lines.

If a refresh cycle is generated, then SYS_ACCESS is a 0 and the output of OR gate 308 is dependent upon the state of the QB output of flip-flop 302. If the state of the flip-flop 302 is a 1 (Q=1, QB=0), then the memory cells associated with row line i are fresh, and the OR gate 308 output is a 0 which inhibits the $DROW_i$ signal at AND gate 310 and $HDROW_i$ is a 0 (i.e., negated). When $HDROW_i$ is a 0, no row line is active (i.e., each of the plurality of transistors 312 are off), which results in the CANCEL signal being a 1, the sense amplifiers are inhibited, and no refresh occurs.

If a refresh cycle is generated and the state of the flip-flop 302 is a 0 (Q=0, QB=1), then the memory cells associated with row line i are stale, and the OR gate 308 output is a 1 which enables the $DROW_i$ signal at AND gate 310 and $HDROW_i$ is a 1 )i.e., asserted). When $HDROW_i$ is a 1, the CANCEL signal is a 0, the sense amplifiers are enabled, and the refresh cycle occurs.

The history of the data stored within a row associated with history decode portion 204a is stored on the Q and QB nodes of flip-flop 302. For example, in one embodiment, a memory array row history bit (Q) would be set active (i.e., 1 for purposes of discussion), to indicate the data stored in the row is fresh, and no refresh is needed in the current MROC. Conversely, if the row history bit is inactive, 0 for purposes of discussion, a refresh is needed in the current MROC to maintain the associated DRAM data.

In summary of FIG. 3, history qualifier cell 204a is any circuit that employs a history bit to indicate data "freshness" in one of two situations. First, the state of the history bit toggles (i.e., changes state) on each refresh cycle if $DROW_i$ is active. Refresh cycles are inhibited if the state of the history bit is fresh and enabled if the state of the history bit is stale. Second, the history bit is set for every system access if $DROW_i$ is also active ($DROW_i$=1). Generally, any circuit may be used to replace the circuit of FIG. 3 as long as the following rules are applicable to the circuit:

(1) Set the history bit i to fresh if:
The row i is selected for refresh and the history bit is in a stale state, or a system access to row i occurs;
(2) Set the history bit i to stale if:
The row i is selected for refresh and the history bit is in a fresh state.
(3) Refresh cycles are inhibited (i.e., row line is held inactive and the sense amplifiers are disabled) when the history bit indicates that row i is fresh.

While capable of being an economical implementation, the circuit of FIG. 3 has a disadvantage. Until at least one memory cell of row i of memory array 212 has been written, the memory cells can be presumed to contain unknown values and are, therefore, unused. If memory array 212 is powered up on reset but one or more rows of the array have not been written, the history bit circuit of FIG. 3 will result in refreshing the unused rows and needlessly consume power.

Figure 16:
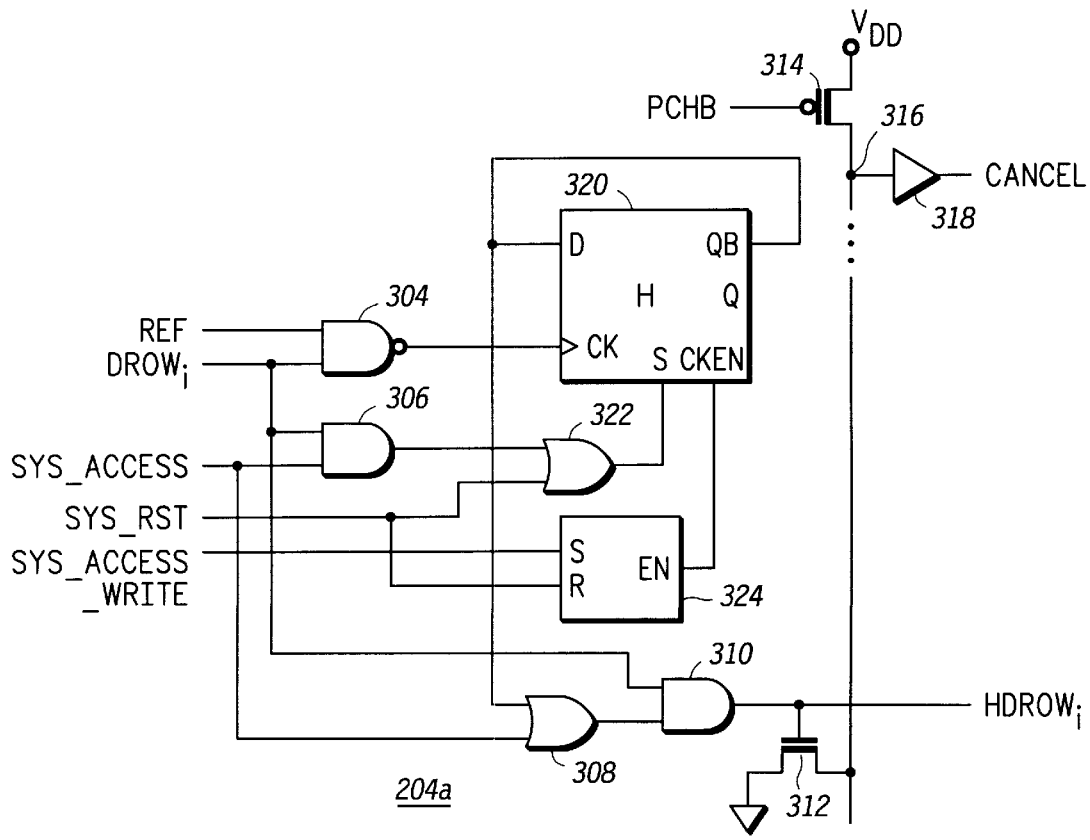
FIG. 16 illustrates, in a circuit diagram, an alternate embodiment of the history bit cell used in FIG. 3 wherein refreshes are disabled for unused memory in accordance with the present invention.

This problem can be overcome with three modifications of the history qualifier circuit 204a as shown in FIG. 16: (1) modify the system reset state of the history bit from 0 to 1 )i.e., from stale to fresh) (2) modify flip-flop 302 to include a clock enable function to create a new flip-flop 320 (labeled as history flip-flop H in FIG. 16), and (3) add an SR (set/reset) latch 324 to control the clock enable function which is connected to a new input signal, SYS_ACCESS_WRITE, that is a 1 during a system write access.

The change in system reset state is accomplished by first disconnecting the SYS_RST signal from the reset (R) terminal of the flip-flop 302. The set (S) terminal connection is then modified to be the output of an added two-input OR gate 322 of FIG. 16 for which SYS_RST and the output of AND gate 306 are the inputs. The flip-flop 302 will now be set (Q=1) when either SYS_RST or the output of AND gate 306 is a 1.

A clock enable function is added by first modifying flip-flop 302 to include a new input terminal called CKEN (Clock Enable). The internal functionality of the flip-flop is modified such that the flip-flop can change state on the positive edge of the clock CK only if the CKEN signal is a 1 )i.e., asserted). When the CKEN terminal input is a 0 (i.e., negated), the flip-flop 302 cannot change state in response to CKEN. The purpose of the CKEN functionality is to prevent the history bit flip-flop for row i from changing from the "fresh" to the "stale" state until a system write of row i occurs.

Adding an SR latch to the history qualifier circuit 204a provides a means to control the added CKEN functionality of flip-flop 302. The added two-input SR latch utilizes SYS_RST and SYS_ACCESS_WRITE as inputs and generates signal EN as the output which is connected to the newly added CKEN terminal of the modified flip-flop 320. When SYS_RST is asserted, the reset portion of the latch negates the EN output (EN=0) which prevents the flip-flop from changing state. When SYS_ACCESS_WRITE (active high) is asserted, the set portion of the latch asserts EN (EN=1) which allows the flip-flop to change state on the positive edge of CK. It should be understood that this latch, in another embodiment, may also be cleared and/or set by software control so that enabling of refresh operations can be user programmable.

Figure 4:
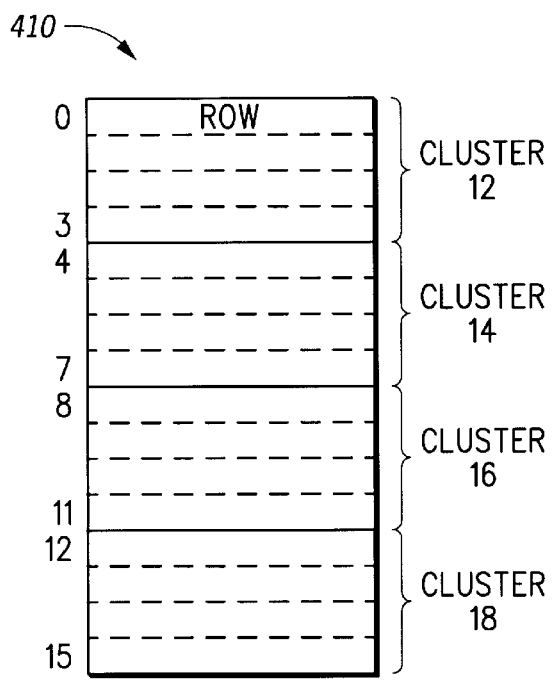
FIG. 4 illustrates, in a block diagram, a memory map structure of a portion of memory used in accordance with the present invention.

The operation of the circuitry 200 and 204a of FIGS. 2 and 3 is best understood with reference to FIGS. 4–7. FIG. 4 illustrates a memory map 410 for a memory block or memory tile having four memory row clusters 12, 14, 16, and 18. In the present example, there are four rows of memory associated with each memory row cluster 12–16. In general, each row 0–3 of each cluster 12–18 will be associated with a page of memory. In the present example, each of the sixteen rows in FIG. 4 would be associated with a page of memory located exclusively in memory array 212. In other embodiments, a page of memory can extend across multiple memory arrays. For example, there may be multiple memory arrays, each array containing a specific row i, where all the ith rows in each array are capable of being accessed as a single composite row referred to as a page.

Figure 5:
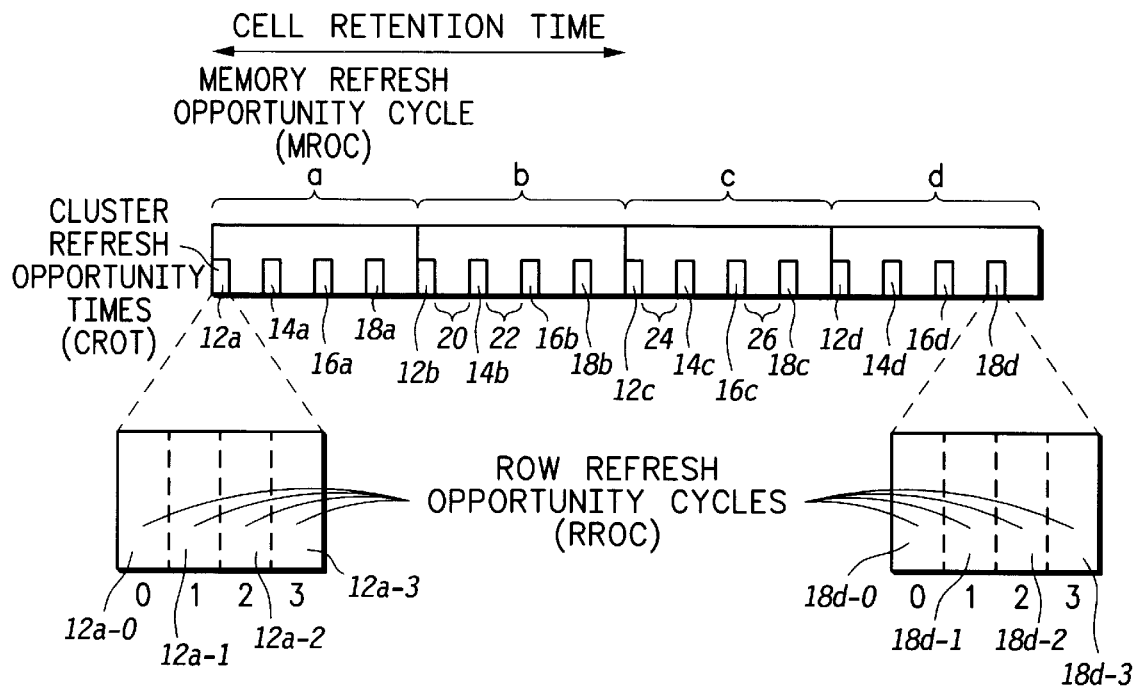
FIG. 5 illustrates, in a timing diagram, a sequence of memory refresh opportunity cycles in accordance with the present invention.

FIG. 5 illustrates a number of timing relationships for an embodiment that does not distinguish between used and unused memory. First, four memory refresh opportunity cycles (MROC) a, b, c, and d are illustrated in FIG. 5 (see FIG. 1 for the first introduction of MROCs). As previously discussed, each row or refresh group of memory cells will be considered for refreshing in each MROC. In the embodiment illustrated, each MROC has four Cluster Refresh Opportunity Times (CROT) 12, 14, 16, 18. During each CROT 12–18 specific rows or refresh groups are refreshed. In other words, a CROT indicates a time during which the rows associated with a specific memory cluster 12, 14, 16, or 18 are evaluated for refresh and, if found to be stale, are refreshed.

In the illustrated embodiment, the CROTs 12, 14, 16, and 18 are spread out over the length of MROC time in a distributed refresh approach whereby different portions of memory are candidates for refresh at different times within each MROC a, b, c, or d. For reference purposes herein, when a period of time 0–3 associated with a specific CROT 12a–18a is referenced in a specific MROC a, b, c, d, the MROC reference letter will be appended to the CROT reference numeral. For example, the label 14b will refer to the CROT time 14 within MROC b. The label 18d will refer to the CROT time 18 within the MROC d. Within each CROT 12a–18a, 12b–8b, 12c–18c, and 12d–18d, there are four Row Refresh Opportunity Cycles (RROC) labeled as 0–3 in FIG. 5, one for each row of memory associated with each of the four clusters 12–18 in FIG. 4. During each RROC one row of the four rows in a cluster 12–18 can be updated. Therefore, up to four rows may be refreshed in each CROT. For reference purposes, when a specific RROC is referenced herein, it will list the RROC number 0–3 after the CROT/MROC alphanumeric recitation. For example, time 16a-2 refers to the third RROC (time slot 2), of CROT 16 in MROC a, whereas 12d-0 refers to the first RROC (time slot 0), of CROT 12 in MROC d in FIG. 5.

Generally, if a memory array 212 contains M clusters and N rows of memory or refresh groups of DRAM cells per cluster (M and N being finite positive integers), then each MROC a, b, c, d in FIG. 5 will contain M CROTs wherein each of the M CROTs will contain N RROCs. Therefore, N*M memory rows or refresh groups are evaluated for freshness and given a refresh opportunity each half-duration of the cell retention time in FIG. 5. Note that a memory sub-system may contain a group of arrays configured in one of many multi-dimensional manners. The refresh methodology discussed herein can be used for any memory configuration.

Figure 7:
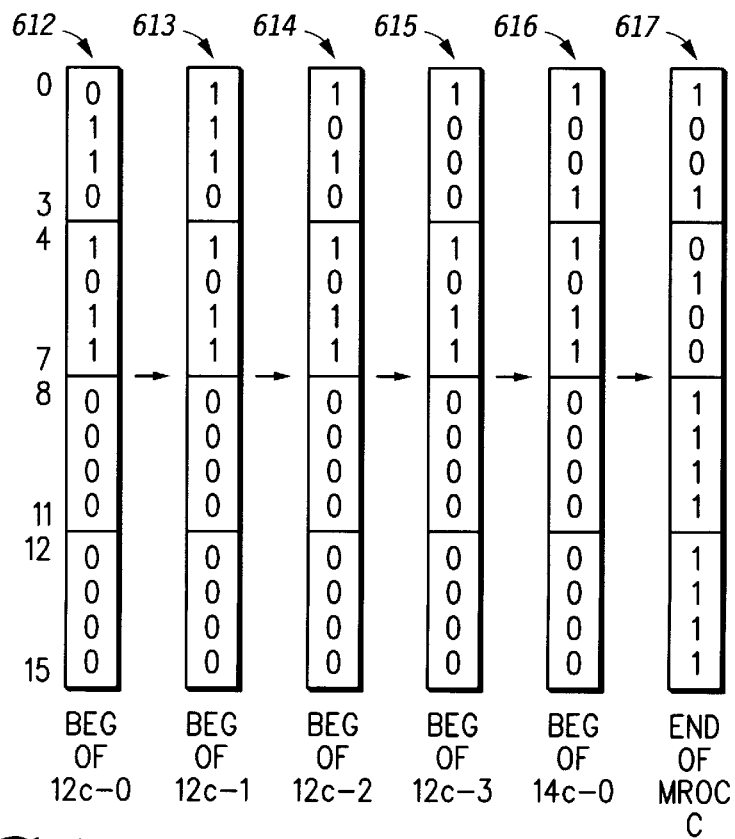
FIGS. 6 and 7 illustrate, in a time sequential state diagram, the logical state of history bits over time within the system of FIG. 2 in accordance with the present invention.
Figure 6:
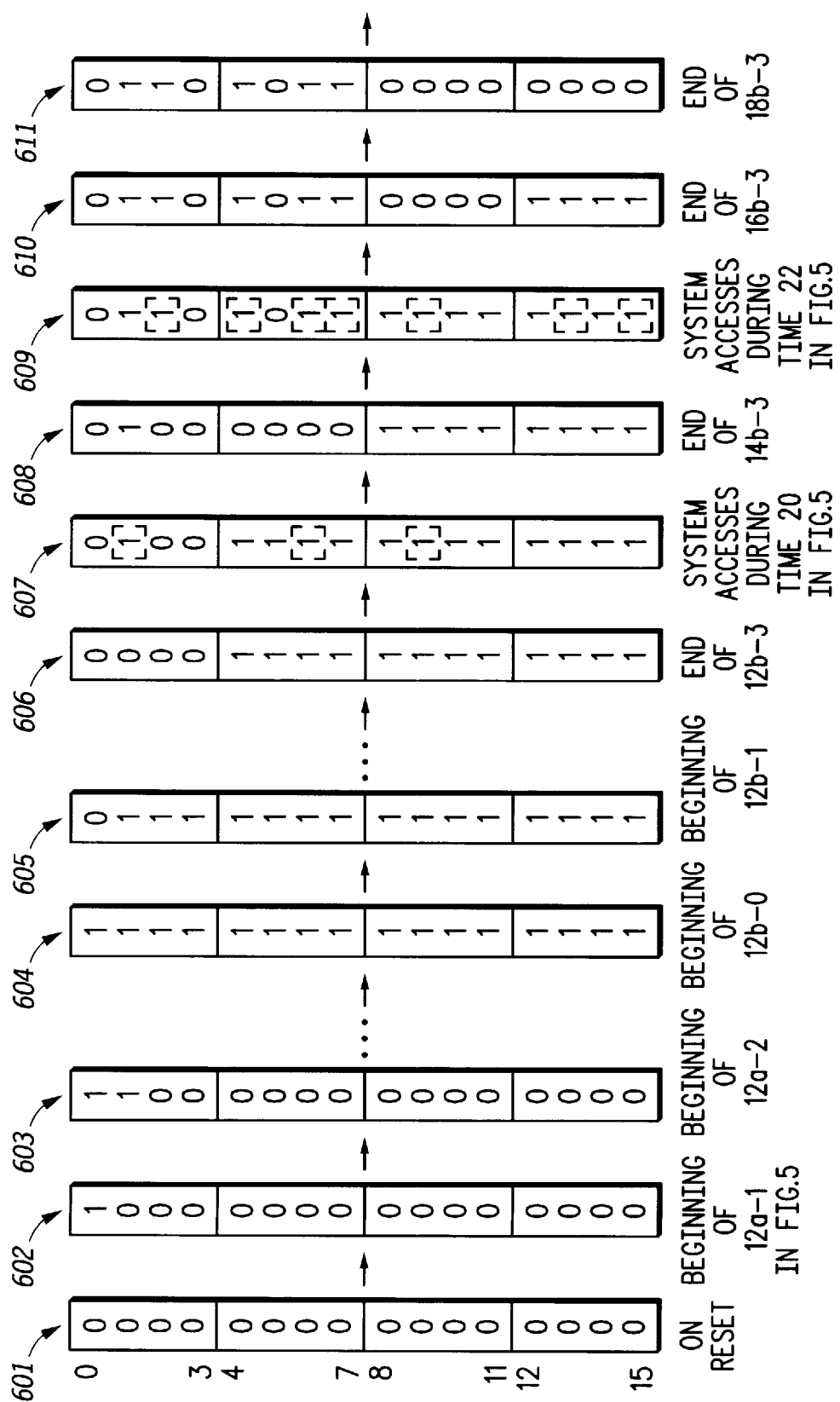

FIGS. 6 and 7 illustrate the history bits which result after the processing in each of the CROTs through FIG. 5 has occurred. In other words, FIGS. 6–7 contain "snapshots" of the contents of the history bits at each time just after the completion of the refresh processing within each CROT in FIG. 5. Since there are sixteen rows of memory or refresh groups in FIG. 4, there are sixteen history bits made from the circuit of FIG. 3 which are labeled 0–15 and shown in FIGS. 6–7. The history bit i in FIGS. 6–7 corresponds to and records history for the respective row or refresh group i in FIG. 4.

History state 601 illustrates that the values of the history bits 0–15 are all set to logic 0 following reset of the system. In other words, on reset, no memory rows or refresh groups are marked as fresh for an implementation not comprehending unused memory. History state 602 indicates the values of the history bits 0–15 at the end of time 12a-0. In the following description, the beginning of a time slot may also be alternatively understood as the end of the prior time slot. At the end of time 12a-0 in FIG. 5, history bit 0, which is associated with row 0 of the DRAM memory array shown in FIG. 4 and analogous to the array 212 in FIG. 2, has been set to 1 to indicate that this row 0 was refreshed during the time 12a-0 from FIG. 5 since the history bit was found to be 0 (therefore indicating a refresh of this row 0 was needed). Since the retention time for a memory cell is at least twice as long as the MROC time in FIG. 5, no refresh needs to occur on this row during time 12b.

History state 603 in FIG. 6 indicates the value of the history bits at the end of time 12a-1 in FIG. 5. Time 12a-2 follows immediately after the end of time 12a-1. In time 12a-1, row 1, of the array 212, is given the opportunity to be refreshed. Since history bit 1, which is associated with memory row 1, was 0 in history state 602 of FIG. 6, row 1 is refreshed. Therefore, history bit 1 in FIG. 6 is set in history state 603 as illustrated. As should now be apparent, the setting of the history bits 2–15 will sequentially continue after state 603 throughout the remainder of time periods 12a, and through time periods 14a, 16a, and 18a, until all rows of memory have been refreshed as shown in state 604 of FIG. 6. History state 604 illustrates that all history bits are set at the beginning of CROT 12b-0 from FIG. 5.

The value of history state 605 is at the end of time 12b-0, which is also the beginning of time period 12b-1, as is shown in FIG. 6. During time period 12b/0, history bit 0 was once again analyzed for refresh using the circuitry of FIGS. 2–3. Since the history bit 0 was set at the time of analysis, it was determined that a refresh was not needed for memory row 0 in MROC b. However, it will be necessary for a refresh of memory row 0 to occur during the next MROC c or the retention time requirement or row 0 of the memory 212 will be violated. Therefore, as indicated in state 605, the history bit 0 is cleared to indicate, in the next memory refresh opportunity cycle (MROC), that it is necessary to update the memory row 0 associated with bit 0.

History state 606 illustrates the bit values at the end of time period cycle 12b-3, whereby all of the history bits associated with cluster 12 have been cleared indicating the entire cluster 12 needs to be refreshed during the next MROC c under current conditions.

History state 607 brackets certain history bits 1, 6, and 9 which are associated with memory rows where a system memory access (e.g., a read or a write) occurred to the memory array during time period 20. Note that reads and writes may occur in any time period between any of the CROTs 12a–18d in FIG. 5. However, FIG. 6 only shows that reads and writes occur in isolated time periods 20 and 22 to properly illustrate a much simplified example for purposes of easier understanding. Therefore, in general, smaller embedded memory arrays (1 Kbit to 1 Mbit, or larger as technology progresses) are likely to contain many memory rows or refresh groups of a DRAM memory tile which were written to or read from between CROT periods. These rows that were read from or written to are "remembered" by history bits to reduce an average number of RROCs needed in an average MROC.

Time period 20 is illustrated in FIG. 5. Period 20 is the period of time specifically illustrated between CROT 12b and CROT 14b in which reads and writes are illustrated to occur. When a memory access occurs for a specific row or refresh group of DRAM cells, it is possible for the history bit associated with that row to be affected so that a scheduled refresh may be delayed in subsequent MROCs. For example, history bit 1 was accessed (e.g., read, write, or both) during time 20. As a result of the access, the memory row 1 of FIG.

4 associated with bit 1 of FIG. 6 was refreshed during the read/write access. Therefore, the refresh which would otherwise occur during the next time period 12*c* can be delayed to time period 12*d* without violating the data retention time of the DRAM memory cells. In summary, any history bit changed from logic 0 to a logic 1 by a read or write (e.g., history bit 1 in state 607) will result in a one MROC delay in the refresh of this particular memory row or refresh group. Therefore, the setting of history bit 1 in state 607 from a logic 0 to a logic 1 creates the one MROC delay and saves power as will be shown later in the example of FIGS. 6–7.

The data associated with rows 6 and rows 9 have also been updated during time 20, as indicated by brackets in state 607. However, since their history bit values are already set, it is not possible to delay the refresh beyond the present MROC. In other words, a history bit set from a logic 1 to a logic 1 via a read and/or write creates no additional power or bandwidth savings.

History state 608 indicates the history bit values at the end of time 14*b*-3 from FIG. 5. As illustrated, the history bits associated with cluster 14 have all been set to 0 indicating that during a next memory refresh opportunity cycle (MROC) they must be refreshed unless inherently refreshed by a read or write that is recorded in the history bits.

State 609 of FIG. 6 illustrates the history bits after several read and write operations to memory in a time period 22 of FIG. 5. In this time period 22 of FIG. 5, memory rows 2, 4, 6, 7, 9, 13, and 15 are either written to or read from whereby the respective history bits 2, 4, 6, 7, 9, 13, and 15 are set in state 609. Note that history bits 2, 4, 6, and 7 transitioned from a logic 0 to a logic 1 from state 608 to state 609 whereby these memory rows 2, 4, 6, and 7 will not be refreshed in the next MROC whereby some power is saved in the embedded DRAM device. The other bits 9, 13, and 15, simply maintain their logic 1 value and therefore no saving results due to the read and/or writes to the memory rows or refresh groups 9, 13, and 15.

History state 610 indicates the history bit values at the end of time 16*b*-3. As illustrated, the history bits associated with cluster 16 have all been set to 0 indicating that during, or before, a subsequent MROC they must be refreshed. No memory writes or reads are illustrated between CROTs 14*b* and 16*b* in this example for simplicity sake, although, in reality, writes and reads would have most likely occurred in all time slots not consumed by refresh operations.

History state 611 in FIG. 6 indicates the history bit values at the end of time 18*b*-3. As illustrated in state 611, the history bits associated with the memory rows 12–15 in cluster 18 of FIG. 4 have all been set to a logic 0 value indicating that during, or before via a read or write, a subsequent memory refresh opportunity cycle (MROC) they must be refreshed by the system.

FIG. 7 illustrates history bits state 612 which follows state 611 of FIG. 6. State 612 shows the history bits logic values at the beginning of time 12*c*-0. Since the state 612 matches the history state 611 no intervening accesses that resulted in a state change occurred between the end of CROT 18*b* and the beginning of CROT 12*c* to keep the illustration simple. History state 613 indicates the values of the history bits at the end of time 0 of row refresh opportunity cycle (RROC) 12*c*-0 (which is the same as the beginning of time slot 1 in RROC 12*c*-1). Note that history bit 0 changed from a logical 0 to a logical 1 between states 612 and 613 indicating that during time 12*c*-0, the row associated with history bit 0 was refreshed whereby the history bit was set in accordance with the refresh of the row 0. By setting bit 0, the history bit 0 indicates that it is not necessary to refresh the row 0 again during a next MROC.

History state 614 illustrates the effect of a refresh not needing to occur during a specific MROC due to a read/write operation in time region 20 of FIG. 5. Specifically, since history bit 1 at the beginning of time 12*c*-1 was set by a previous read or write, a refresh that would otherwise have occurred during time 12*c*-1 is canceled, and history bit 1 is cleared as illustrated in state 613 to indicate that a next MROC should refresh the row 1 (unless another read or write subsequently occurs). By not refreshing the row 1 associated with history bit 1 immediately following an access to the row, power savings over the prior art is realized. In other words, by keeping track of read and write history to a DRAM row, refresh operations on these rows may be delayed thereby saving power. The power savings is realized because the memory cells associated with the recently written or read memory row do not need to be refreshed immediately following the access. A read or write access in the DRAM architecture inherently performs a refresh operation.

History state 615 shows that bit 2 of the history state has been cleared meaning that no refresh was performed in this MROC but a refresh will be necessary in the next MROC 12*c*-2. Similar to bit 0 of states 612–613, history state 616 shows the effects of a refresh to the row associated with bit 3 during time 12*c*-3.

State 617 of FIG. 7 shows the logical values of the history bits at the end of the MROC c of FIG. 5. Due to the reads and writes, in time periods 20 and 22 of FIG. 5 that created the bracketed '1' values in states 607 and 609, the rows 1, 2, 4, 6, and 7 needed no refresh in MROC c where refreshing is deferred to MROC d for these five memory rows. Therefore, power can be saved by delaying or preempting the refresh of rows that have been recently refreshed by a read or write operation.

It should be apparent by now that the present invention offers distinctive advantage over the prior art which would refresh all memory rows regardless of the refreshing occurring for read and write operations. Specifically, a refresh of a specific row of a memory array does not occur if a previous system access (e.g., read or write) occurred within one-half of a cell retention time before a scheduled refresh operation. This allows for the refresh to be delayed by one-half of a cell retention time before occurring. In fact, if a row of memory is constantly written and/or read, that memory row may never need to be refreshed by a controller refresh operation throughout the operation of the embedded DRAM device. By delaying refreshes, an energy savings results.

Figure 8:
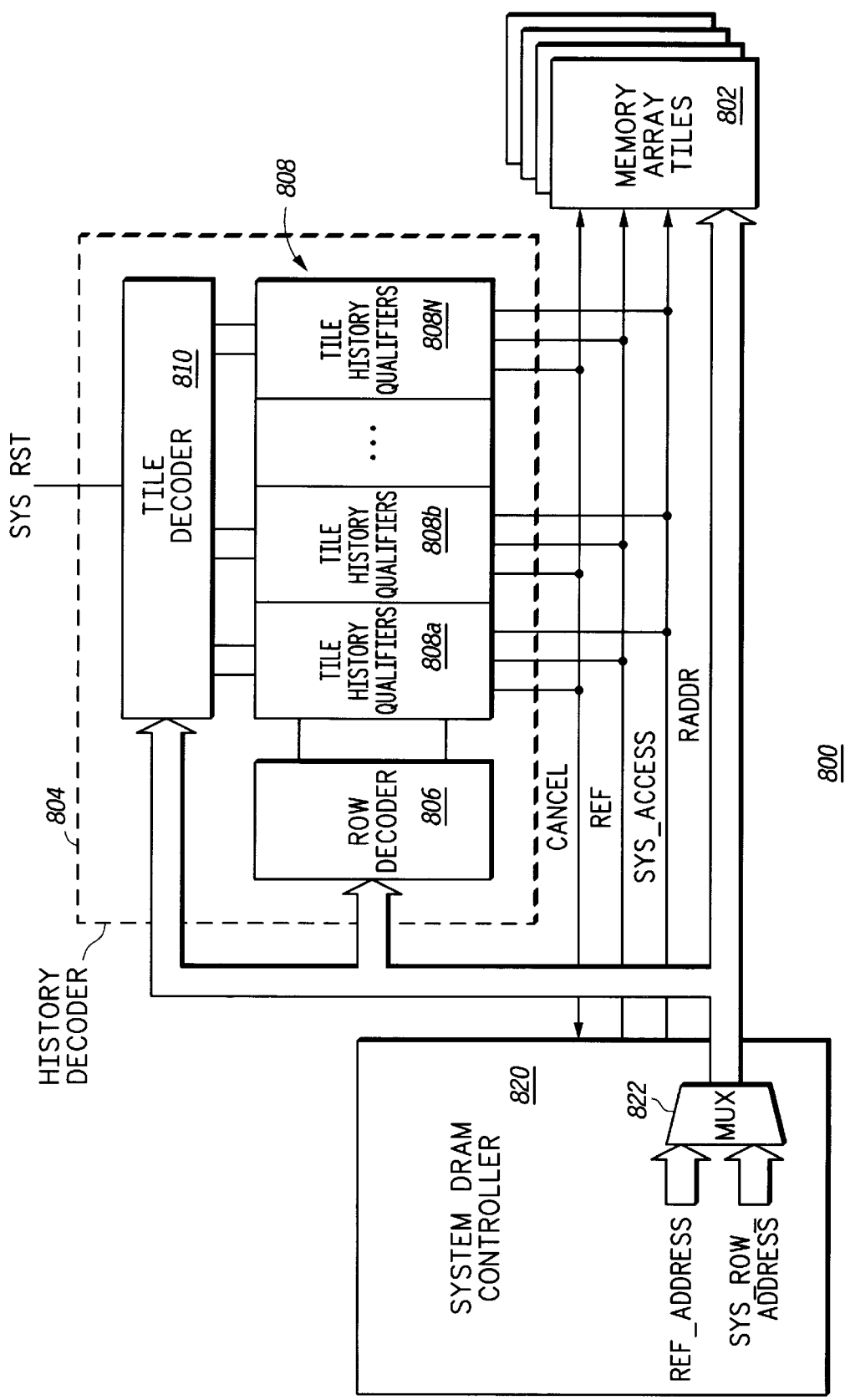
FIG. 8 illustrates, in a block diagram, an alternate memory system in accordance with the present invention.

FIG. 8 illustrates a memory system 800 comprising a system DRAM controller 820, history decoder 804, and memory array tiles 802. In contrast to the memory system 200 of FIG. 2 which has history bits located locally within the various memory blocks/tiles and usually in line with the memory row decoder, the memory array system 800 has a stand alone history decoder 804. In other words, the decoder 804 collects all of the history bits into a centralized area separate from the memory array tiles 802.

In order to support a plurality of memory array tiles 802 as illustrated in FIG. 8, it is necessary for the history decoder 804 to have a tile decoder 810 to determine which of the memory tiles is currently being accessed for a refresh operation. The tile decoder 810 selects the appropriate set of tile history qualifier bits 808 for that selected tile in order to maintain the proper history status of the memory rows or memory refresh groups within the memory array tiles 802. The row decoder 806 of FIG. 8 receives either a system address (SYS_ROW_ADDRESS) or a refresh address (REF_ADDRESS) from MUX 822. The refresh address can be either a centralized refresh address sourced from the memory controller or a duplicate of the refresh address generator which resides in each tile where all refresh address generators are reset to a know value by system reset (SYS RST) and all refresh address generators have the same value. This address value is decoded by a duplicated and dedicated row decoder 806 to determine which set of history bits in an array of tile history qualifier bits 808a, 808b, . . . , 808N is selected for processing and/or updating for each system access and/or refresh operation. For system accesses, decoders 810 and 806 provide a two-dimensional X-Y decoder scheme whereby a single history element is selected by the decoders 810 and 806. Refresh accesses operate similar to system accesses except all tiles are selected by the tile decoder 810.

Generally, FIG. 2 and FIG. 8 illustrate two different embodiments which may be used to layout the history bit information. The first embodiment illustrated in FIG. 2 illustrates that the row decoders and history bits are a portion of the memory array tiles whereby each memory tile or memory block has its own history bit. The second embodiment, as illustrated in FIG. 8, illustrates a stand-alone history bit circuit containing row decode, tile decode and centralized history bits for accessing a plurality of separate memory array tiles. The system of FIG. 8 is more conducive for use when the history bit circuitry consumes too much area to allow inclusion within an individual tile (i.e. is too large to fit in the row decoder pitch) or in situations with hierarchical memory structures in which a single history bit is used to record the history state of the same row address in multiple tiles.

While the system described in FIGS. 1–8 has advantages of low overhead, ease of implementation, and power savings, more complicated history logging techniques could provide added performance benefit. These other alternative embodiments are discussed with reference to FIGS. 9–15.

Figure 9:
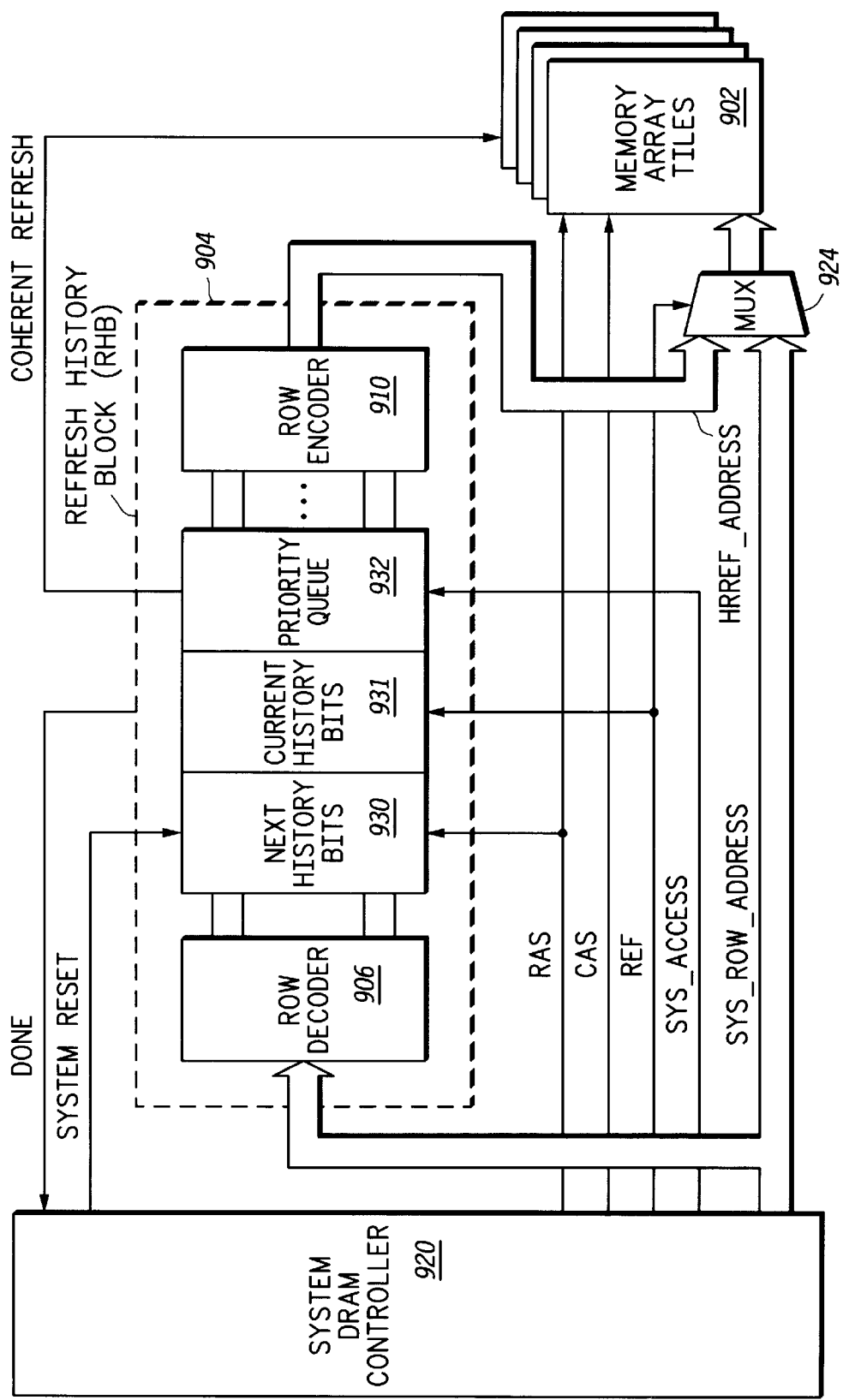
FIG. 9 illustrates, in a block diagram, yet another alternate memory system in accordance with the present invention.

FIG. 9 illustrates a memory system 900. Memory system 900 comprises a system DRAM controller 920, refresh history block (RHB) 904, memory array tiles 902, and multiplexor 924. System DRAM controller 920 provides signals labeled as row address strobe (RAS), column address strobe (CAS), refresh (REF), system access (SYS_ACCESS), and system row address (SYS_ROW_ADDRESS), and system reset (SYS RESET or SYS RST). In addition, the system DRAM controller 920 is coupled to the RHB 904 to receive a signal labeled DONE. The refresh history block 904 has input nodes for receiving the row address strobe (RAS), refresh (REF), system access (SYS_ACCESS), and system row address (SYS_ROW_ADDRESS), and system reset (SYS RESET or SYS RST). In addition, the refresh history block 904 has an output bus for providing a history row refresh address labeled as HRREF_ADDRESS. The refresh history block 904 further comprises a row decoder 906, a next history bit portion 930, a current history bit portion 931, a priority queue 932, and a row encoder 910.

In operation, the multiplexor 924 of FIG. 9 is controlled by the refresh signal (REF) and selects as an output either the SYS_ROW_ADDRESS or the HRREF_ADDRESS. When the SYS_ROW_ADDRESS value is selected, the memory array tiles 902 are selected appropriately based directly upon the read or write addressing information in the SYS_ROW_ADDRESS. When the refresh signal (REF) is active, the multiplexor (MUX) 924 selects the HRREF_ADDRESS value which provides the refresh row addressing information after being appropriately generated by the refresh history block 904. Therefore the MUX 924 switches addressing information to the memory tiles based upon whether a system access (read and/or write) or a refresh operation is to occur.

The refresh history block (RHB) 904 receives the system row address information (SYS_ROW_ADDRESS) as an input of the row decoder 906. During a refresh cycle, the information provided by the SYS_ROW_ADDRESS indicates a last memory address or stopping address to be refreshed during a current refresh burst. In other words, the SYS_ROW_ADDRESS is a pointer to the place within the history bit array where the burst of refreshes should stop. By using the SYS_ROW_ADDRESS as a stop pointer and a bit in the priority queue 932 as a current pointer, a defined range of memory can be processed in each memory refresh burst. This defined range of memory may be programmable by the user or fixed in the architecture. The use of the SYS_ROW_ADDRESS in conjunction with a bit in the priority queue 932 is discussed in specific detail in FIGS. 10–13.

As a simple example, assume that a first memory cluster comprising memory rows 0–3 are to be refreshed during a CROT time 12a of FIG. 5. The memory controller 920 would preferably provide a SYS_ROW_ADDRESS value of 3 indicating that during this period of time only those rows 0–3 associated with bits 0–3 are considered for refreshing in CROT 12a. If, when the value of SYS_ROW_ADDRESS is 3, the pointer in the priority queue 932 is in the range of 0–3 then refreshing will be done in the CROT 12a. If the current or start pointer in the priority queue 932 contains a value greater than 3, then no refreshing is needed in CROT 12a. In this case, power is saved and unused refresh cycles can be relinquished to the embedded CPU for more DRAM access bandwidth. In a similar manner, if the value of the system row address signal during a refresh cycle is 11, and the starting pointer in the priority queue 932 is less than the value of 11 then only rows between the starting pointer in the priority queue 932 and the history bit set 11 would be accessed for refreshing. This type of start and end pointer process may also be used in the embodiment of FIGS. 1–7.

The RHB 904 in FIG. 9 determines the next row needing refreshing using the starting pointer in priority queue 932 and the end of the range of row addresses specified by the SYS_ROW_ADDRESS value. Each and every row in a cluster is considered for refreshing in that cluster's refresh opportunity time (CROT), and the row decoder provides the row addresses in sequential order within the cluster. For example, during CROT 14a of FIG. 5, the SYS_ROW_ADDRESS presents the value 7 to the RHB indicating that 7 is the end of the range of addresses to be considered by the CROT. Now assume that rows 4–7 all need to be refreshed. The priority queue 932 and row encoder 910 would generate row addresses 4, 5, 6, and 7 for multiplexor (MUX) 924. Those rows needing refreshing are refreshed, and rows not needing to be refreshed are skipped with no bandwidth or power consumed by the embedded DRAM array for those rows that are skipped.

The next history bit portion 930 and the current history bit portion of the history bits 931 determine whether a specific memory row or refresh group needs to be refreshed in the current memory refresh opportunity cycle (MROC) or if the refresh of the specific memory row or refresh group may be postponed until the next MROC. Generally, the current history bits are processed to determine what to refresh or not refresh in the current MROC and the next history bits are selectively updated in the current MROC for use in the next MROC's processing (e.g., the next history bits are transferred to the current history bits when the next MROC becomes the current MROC). The priority queue 932, provides a pointer to the row encoder 910 indicating the next row to be refreshed. Note, through the use of the priority queue 932, those rows which do not need refreshing in a RROC will be bypassed and, in their place, another row within the current range will be considered for refresh. If no other row is to be considered for refresh (i.e., the pointer has propagated past the address indicated by the SYS_ROW_ADDRESS), then no more refreshing is considered and a DONE signal is asserted to return control to the CPU for system accesses, which improves system bandwidth. In other words, unlike the first embodiment illustrated previously by FIGS. 6 and 7, there is no fixed time during which a refresh will occur or not occur for any specific row in a cluster. To the contrary, if there are four rows in a cluster that must be considered for refreshing in a CROT, then the CROT will have four RROCs (see FIG. 5). If, however, only rows 1 and 3 of this cluster needs refreshing, then in the present embodiment row 1 will be refreshed in RROC 0 and row 3 will be refreshed in RROC 1, whereby the two unused RROC refresh slots will be given back to the system for system accesses. When a particular memory row or refresh group needs refreshing, as determined by RHB 904, the row encoder 910 provides that particular history row refresh address (HRREF_ADDRESS) signal to the multiplexor (MUX) 924 to enable refreshing of memory array tiles 902.

FIGS. 10–13 illustrate a series of history states 1010–1032. The history states 1010–1032 in FIGS. 10–13 have a next history (NH) column, a current history (CH) column, and a priority queue (PQ) column. The current history (CH) column contains 16 history bit values 0–15 that are associated uniquely with either memory rows 0–15 or refresh groups 0–15 for the current MROC. The next history column (NH) indicates the history states that will be transferred to the CH column when the next MROC becomes the current MROC at completion of a current MROC. A third column containing a priority queue (PQ) shows how this priority queue, in conjunction with the SYS_ROW_ADDRESS to the row decoder 906, controls the selection of which row should be refreshed (if any) in the current CROT. The priority queue provides a signal indicating the next row to be refreshed. The PQ column is a one-hot vector of logic values in which the position of the one indicates the row to be refreshed.

History state 1010 represents the state of all history bits at a start of time period 12*a*-0 of FIG. 5. All of the next history (NH) bit values are cleared by a system reset signal asserted on system start-up or are cleared by RHB 904 of FIG. 9 at the beginning of every new MROC. In other words, at the beginning of a new memory refresh opportunity cycle (MROC, see FIG. 5), the next history (NH) values of FIG. 10 will all be set to 0, because there is no insight into how specific rows should be updated in a subsequent memory refresh opportunity cycle (MROC). Since there is no insight, it is assumed that all rows are to be refreshed in the next MROC. The current history (CH) bit values in state 1010 are as illustrated for purposes of example. The CH bit values of state 1010 of FIG. 10 could have obtained these values, for example by various read and write accesses to the embedded DRAM in a previous MROC cycle. The priority queue (PQ) output values intelligently sequence through the current history (CH) bits in a numerical and circular fashion from its last position until another logical 0 current history (CH) bit is found, which will be referred to as an ith bit in the CH column. The priority queue 932 then flags this ith CH bit for a next RROC by setting the ith bit in the priority queue (PQ) 932 as in FIGS. 10–13. Therefore, the logical 1 bit in the PQ column in FIGS. 10–13 indicates the memory row or refresh group that is to be refreshed on a next available RROC.

History state 1011 occurs at the beginning of the next time period RROC 12*a*-1 in FIG. 5 after the RROC 12*a*-0 is complete. As illustrated, the current history (CH) bit and the next history (NH) bit in state 1011 for memory row or refresh group 0 have both been set because the DRAM row 0 or refresh group 0 was refreshed in RROC 12*a*-0. Because the next history (NH) bit 0 is set in state 1011, the DRAM row 0 associated with NH 0 will not be refreshed in the next memory refresh opportunity cycle (MROC). In summary, once a memory row i is refreshed, both the NH bit i and the CH bit i are set. The CH bit allows the priority queue (PQ) to proceed past row i and the NH bit will suppress a refresh of row i during the next MROC. Referring to FIG. 5, this dual setting of both the NH and CH bits in response to a refresh is due to the fact that two memory opportunity refresh cycles (MROCs) are positioned within one memory data retention time. After the RHB 904 refreshes the row 0, the priority queue (PQ) value is then changed in a circular scanning manner to point to the next CH=0 bit in the array. Therefore, the priority queue 932 will skip the CH=1 bits in history bit positions 1 and 2 in state 1011 and set PQ output 3 in state 1011 to indicate that row 3 is the next row that needs refreshing (in other words, rows 1 and 2 are not refreshed and therefore two RROCs are avoided in this particular CROT 12*a*). Note that this is an advantage over the prior art, in that there is no bandwidth consumed by canceled refreshes of rows 1 and 2.

The history state 1012 indicates the status of the history bits at the beginning of RROC 12*a*-2. Since this time follows the time RROC 12*a*-1 which was used to refresh memory row 3 associated with CH bit 3, the next and current history bits for bit 3 have been set as discussed above, and the priority queue's (PQ's) active output is once again updated to the next row needing a refresh. In state 1012 of FIG. 10, the priority queue 932 will skip over the rows 4–7 and set the PQ output for row 8 as illustrated since the CH=1 bits of rows 4–7 indicate that no refreshing is needed for these rows 4–7 in the current MROC a (See MROC a in FIG. 5). Because the value on the SYS_ROW_ADDRESS is set to 3 for all first CROTs in any MROC, the refresh consideration stopping point for CROTs 12*a*–12*d* is the address value 3. Therefore, since the PQ pointer is set to 8 which is beyond the stop pointer 3 signified by the SYS_ROW_ADDRESS=3, there are no more memory rows or refresh groups that need to be considered in the CROT 12*a* for memory cluster 12. Therefore, the memory system 900 of FIG. 9 would provide an active DONE indicator in order to notify the system DRAM controller 920 that no more RROCs are needed in CROT 12*a* to refresh rows. Therefore, only two RROCs 0 and 1 out of the total available four RROC 0–3 are used by the CROT 12*a* to refresh all the memory within the cluster 12 whereby a 50% savings in bandwidth is obtained in CROT 12*a* by performing an intelligent refresh based on history. This provides an advantage in that unused refresh time is available for system accesses.

Figure 10:
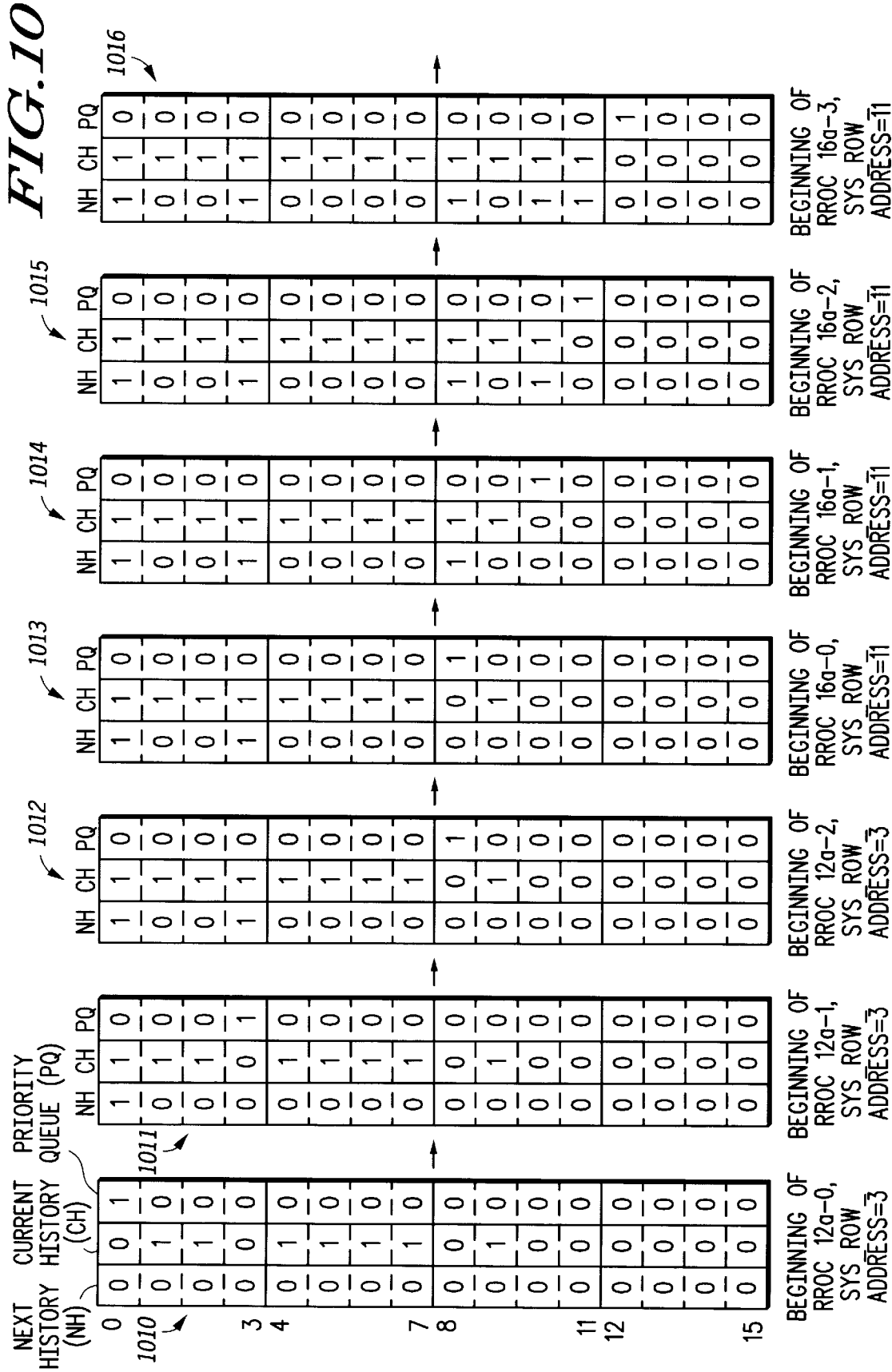

Because all of the rows 0–7 associated with CH bits 0–7 contain active bits (i.e. CH=1) in the current history column of state 1012, the entire cluster refresh opportunity time (CROT) 14*a* will be obviated. In other words, all of the four available RROCs 0–3 in the CROT 14*a* are given back to the system for system accesses since no memory rows 4–7 in cluster 14 are in need of any type of refresh. Note, there may be a short amount of overhead wherein the refresh history block 904 signals the memory controller 920 that a refresh need not occur. However, for all practical purposes the entire cluster refresh opportunity time is freed up for system accesses and any lost time should be either non-existent or negligible. For the above reasons, no states are shown in FIG. 10 for the CROT 14a since this entire CROT 14a is obviated showing the significant savings that can be obtained using the intelligent refresh algorithms taught herein.

State 1013 indicates the values of the history bits at the beginning of time period 16a-0 of FIG. 5. At this time, the DRAM controller 920 has provided a SYS_ROW_ADDRESS value of 11 (note that the SYS_ROW_ADDRESS of 7 is not shown because no refreshes were performed in CROT 14a and the DONE signal was immediately asserted). The history states 1012 and 1013 are identical due to the lack of processing in CROT 14a and due to the fact that no reads or writes are shown in the early stages of FIGS. 10–13 to avoid a confusing example. Read and writes are added to the example of FIGS. 10–13 in later states. History state 1014 indicates the beginning of the time 16a-1, which occurs immediately following the RROC 16a-0. The effects of time period 16a-0 can be seen in state 1014. In state 1014, both the next and current history bits (NH and CH) have been set to a logical one at the bit location 8 due to the refreshing of the memory row 8 in accordance with the PQ output 8 being set in state 1013. Following the row refresh of row 8 due to the set state of PQ output 8 and the fact that the PQ output position 8 was less than the SYS_ROW_ADDRESS=11, the history bits NH 8 and CH 8 are set in state 1014 indicating that the PQ set bit may proceed beyond row 8, and no refresh of row 8 is required in the next memory refresh opportunity cycle (MROC). The priority queue (PQ) active output scans once again to rest at the bit position 10 in state 1014 thereby indicating that the memory row or refresh group 10 associated with bit 10 is to be refreshed in the next possible RROC.

The history state 1015 illustrates the status of the history and priority bits at the beginning of time 16a-2. During time period 16a-1, the current and next history bits 10 (CH 10 and NH 10) were set indicating the refresh of row 10 or refresh group 10 occurred in CROT 16a as required by the PQ output 10. In addition, the priority queue active bit is moved, after refresh of row 10 is initiated, to the next row or refresh group that is to be refreshed.

History state 1016 illustrates the status of the history bits and priority bits at the beginning of time period 16a-3. By the beginning of bit 16a-3, all rows associated with bits 0–11 have been refreshed, as indicated by the logic one value in the CH bits 0–11 in state 1016. Since the asserted PQ output is at location 12 in the state 1016 wherein 12 is greater than the value 11 as indicated by SYS_ROW_ADDRESS, the CROT 16a is terminated with the one remaining and unused RROC 16a-3 being given back to the embedded CPU for system accesses.

Figure 11:
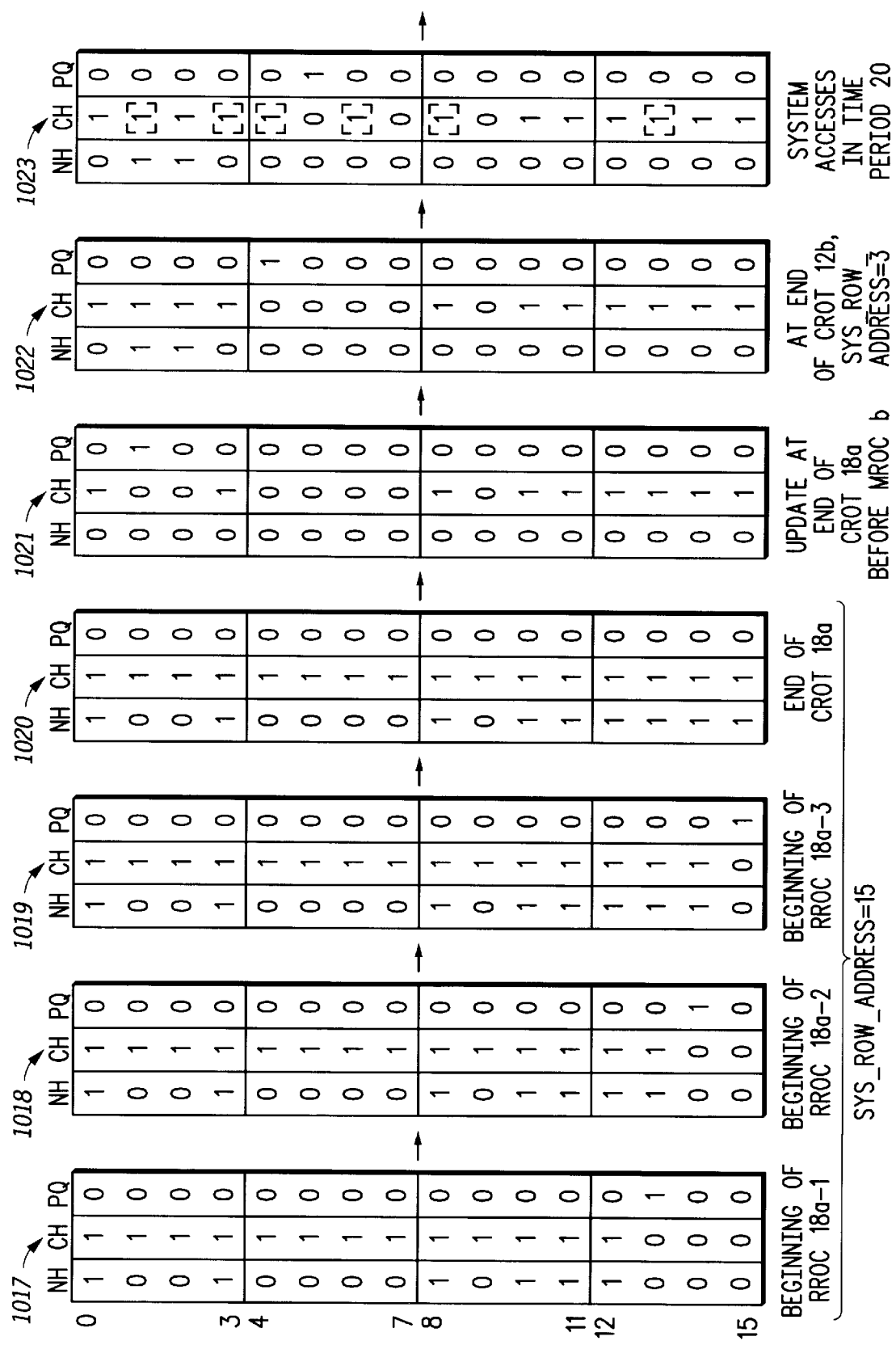

FIG. 11 illustrates a history state 1017 which follows the history state 1016 from FIG. 10. History states 1017–1020 illustrate the effects of refreshing during the cluster refresh opportunity time (CROT) 18a of FIG. 5. Specifically, it is illustrated that each of the rows associated with bits 12–15 were refreshed during the time 18a using all of the available four RROC periods. This is evidenced in state 1020 by both the next and current history bits (NH bits and CH bits) being set in all four locations 12–15 in state 1020. Since all four RROCs were used in CROT 18a, no cycles from CROT 18a are given back to the system to improve system access bandwidth.

History state 1021 illustrates the final effects of completing one memory refresh opportunity cycle a (MROC a, see FIG. 5) and entering another MROC b. The entire effect of the history bits during MROC a is shown in states 1010–1021 of FIGS. 10–11 wherein states 1010–1021 were simplified in example by assuming no read and write activity occurred within MROC a. In state 1021, at or prior to the start of the next MROC b, the values stored in the next history (NH) bit column are transferred to the current history (CH) bit column as shown. In addition, the next history bit values are cleared as indicated in state 1021 to begin a new next history (NH) accumulation time period.

Generally, at the end the last CROT of every memory refresh opportunity cycle (MROC a, b, c, d, etc.) an update of the current history (CH) buffer and next history (NH) buffer occurs. Specifically, before leaving one memory refresh opportunity cycle (MROC) and entering the next memory refresh opportunity cycle (MROC) it is necessary to copy the next history (NH) buffer associated with the history state into the current history (CH) buffer. This is because, upon entering a new memory refresh opportunity cycle (MROC), the data previously referred to as the next history (NH) will actually become the current history (CH). Therefore, as illustrated in history state 1021, the values previously associated with the next history state are now stored in the current history state. In turn, as previously discussed, the next history (NH) bits are all cleared since a new next history period is beginning.

Figure 12:
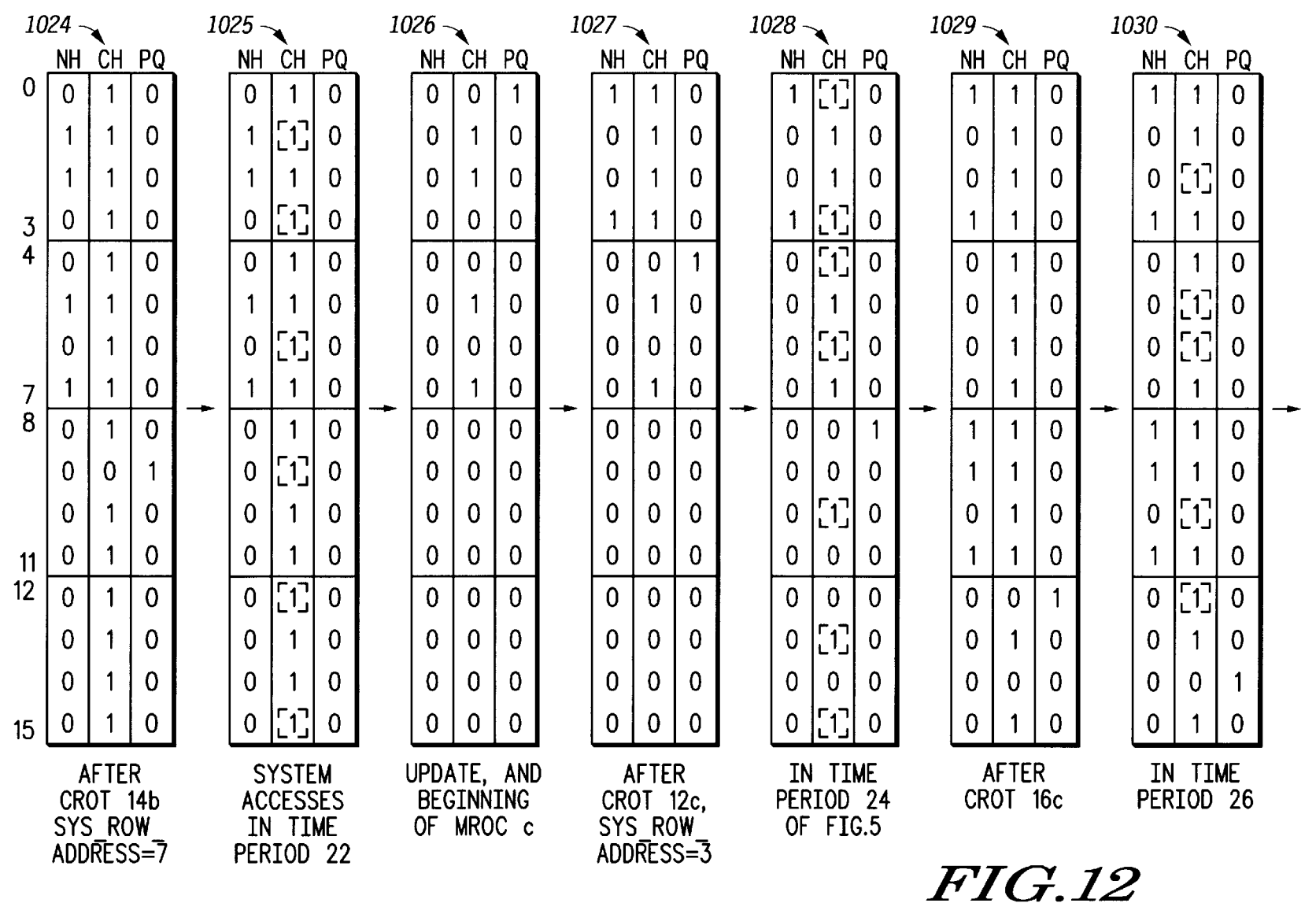

To progress more efficiently through the description of the example, the states in FIGS. 11–12 are now described at a CROT level and not the hierarchically-lower RROC level previously described in FIGS. 10–11. History state 1022 in FIG. 11 therefore indicates the values of the history bits and priority queue at the end of CROT 12b. As illustrated, only the rows associated with CH bits 1 and 2 were refreshed during this time period using two of the four available RROCs. The active bit of the priority queue (PQ) 932 indicates that the memory row 4 associated with CH bit 4 is the next memory row to be refreshed where this refresh is to occur in the next CROT 14b.

History state 1023 indicates that six system accesses (read and/or write) occurred during time period 20 in FIG. 5, which occurs before CROT 14b but after CROT 12b. As illustrated by the bracketed values, memory rows 1, 3, 4, 6, 8 and 13 were accessed by the system during this time period 20. When a system access occurs to any row in a specific MROC, it is not necessary to refresh the bits associated with that row again in the same MROC. Therefore, if a history state indicates that a refresh is scheduled for a row (i.e. CH=0) and prior to the execution of the refresh, a system access occurs, the currently pending refresh would be canceled by setting the CH bit (CH=1) as a consequence of the system access. The set bit would indicate that the row was just refreshed by a read and/or a write thereby preventing an upcoming unneeded refresh during the same MROC. If a system access occurs during time 20 to a row of cluster 14, then a refresh of the row is required before CROT 14d. Therefore, the row must be refreshed during CROT 14c (i.e. the NH bit should not be set to a 1) but the row can be skipped for refresh during CROT 14b (i.e. the system access sets the CH bit to a 1). For example, bit 4, at the end of time 12b was set equal to a logic 0 value. This logic 0 value indicated that, sometime during the current MROC, the row associated with bit 4 should be refreshed. However, since row 4 was accessed by the system during the time period 20 of FIG. 5, no further refreshing is needed during the current MROC. Therefore, the system access would set the current history bit associated with row 4 to allow the upcoming current MROC refresh to be avoided. Likewise, in state 1023 the current history bit 6 was also set in response to a read and/or write access. Note that a system access has no effect when the CH bit of the row or refresh group that is read and/or written is already a logic one. In other words, when the system-accessed memory row is already associated with a set CH bit, and therefore, was not scheduled for a refresh in the current MROC, the read/write operation does not have a refresh savings in this embodiment.

In FIG. 12, history state 1024 continues after state 1023 of FIG. 11. State 1024 shows history bit values following the cluster refresh opportunity time (CROT) 14b of FIG. 5. In cluster refresh opportunity time (CROT) 14b, the next and current history bits (CH and NH) are set for memory rows 5 and 7 since only rows 5 and 7 are within the range of selected rows 4–7 which had CH=0 values in state 1023. Therefore, only two out of four available RROCs were used in order to ensure adequate DRAM data retention in all of the memory rows 4–7 until the next MROC. In state 1024, the next history bits associated with rows 4 and 6 have not been set because rows 4 and 6 were indicated as fresh (i.e., CH=1) in state 1023. When the value of a CH bit is logical 1, that means that the refresh of the row corresponding to this CH bit is not to be refreshed in the current MROC, whereas the NH bit should remain zero to ensure that the next MROC refreshes this memory row to ensure proper DRAM data retention. Rows 4 and 6 did not need refreshing in the current MROC due to the read/write operations in state 1023 of FIG. 11.

Next, in history state 1025 of FIG. 12, system accesses during time period 22 of FIG. 5 are performed. During this time 22, memory accesses occur to rows 1, 3, 6, 9, 12 and 15 in the example of FIG. 12. These accesses are indicated by the bracketed values in FIG. 12, state 1025. While the accesses to rows 1, 3, 6, 12 and 15 have no effect on refreshing because there is no scheduled memory refresh for those rows during the current memory refresh opportunity cycle (MROC), the system accesses in state 1025 affect the refresh procedures of row 9. Row 9 is affected since the access of row 9 actually resulted in a CH=0 bit being set to a CH=1 bit. In history state 1024, row 9 had been scheduled by the PQ outputs to be the next refreshed row. However, due to the access during the time period 22, row 9 is no longer is scheduled for refreshing in this MROC by the PQ outputs.

In fact, following the memory accesses that occurred during time 22, the PQ outputs no longer identify any remaining row that needs refreshing in the current MROC. Since no PQ output is set, no refresh needs to occur in either CROT 16b or CROT 18b since all CH bits are set to a logical 1 as indicated in history state 1025.

History state 1026 of FIG. 12 illustrates the state of the history at the beginning of the next memory refresh opportunity cycle c (MROC c, see FIG. 5). Therefore, the next history (NH) state has been effectively shifted to be in the current history (CH) state, and the next history state subsequently cleared to indicate the beginning of a new memory refresh opportunity cycle c (MROC c).

History state 1027 in FIG. 12 indicates the values of the history states following cluster refresh opportunity time CROT 12c (see FIG. 5 for the hierarchy of MROCs, CROTs, and RROCs). Specifically, the memory row locations 0 and 3 have been refreshed in state 1027 and their next and current history bits (NH and CH) appropriately set as discussed herein above. The set PQ output iteratively progresses through all the rows 0–3 stopping only at those rows needing refreshing and eventually progresses past the range limited by the SYS_ROW_ADDRESS=3 stopping pointer to settle at row 4 as in state 1027.

Next, history state 1028 of FIG. 12 indicates the effects of system memory accesses that occur during a time period 24 in FIG. 5 between cluster refresh opportunity times (CROTs) 12c and 14c. As indicated in history state 1028, system memory accesses occurred at bracketed rows 0, 3, 4, 6, 10, 13 and 15 whereby the history bits 4, 6,10, 13 and 15 were affected (i.e. CH=0 changed to CH=1) by these system accesses. As a result of the system memory accesses, a refresh no longer needs to occur in the present MROC for memory rows 4, 6, 10, 13 or 15. Since the PQ=1 output now indicates bit 8 is the next row to be refreshed, time 14c has been entirely freed up for other system memory accesses and CROT 14c will be entirely skipped over by immediately asserting the DONE signal from the refresh history block (RHB) 904 of FIG. 9.

History state 1029 of FIG. 12 illustrates the history bit values of the history states after the CROT 16c. After the CROT 16c, the rows associated with bits 8, 9 and 11 have been refreshed, and their corresponding NH and CH bits both being written to a logical 1 for reasons discussed above.

History state 1030 indicates the values associated with the history states at the end of the time period 26 between CROTs 16c and 18c in FIG. 5 where some system accesses to the embedded DRAM occur as indicated by bracketed values in FIG. 12. The read/write access in period 26 to the row associated with bit 12 of the history state 1030 resulted in the 0 to 1 transition on the CH bit 12 which indicates that a refresh saving will be obtained. Since the row associated with bit 12 of history state 1030 was scheduled to be refreshed in the current memory refresh opportunity cycle (MROC), the memory access to row 12 had the effect of setting CH bit 12 thereby eliminating the need to refresh this row 12 in the current memory opportunity cycle (MROC). For this reason, the priority queue 932 has progressed the PQ=1 output from CH bit 12 to CH bit 14 in state 1030 of FIG. 12 to indicate that the system accesses of period 26 now render row 14 to be the next row to be refreshed.

Figures 13, 14:
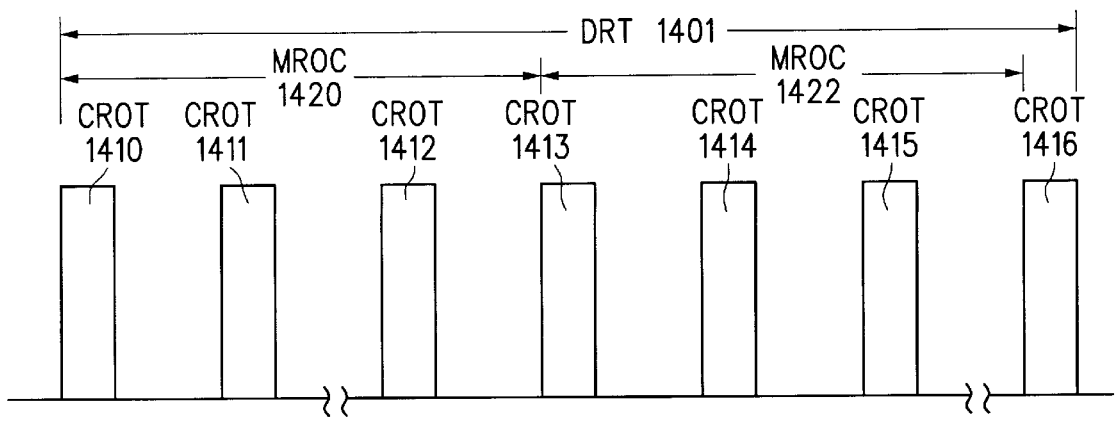

In FIG. 13, a history state 1031, which follows history state 1030 in time, indicates the state of the history state values following the cluster refresh opportunity time (CROT) 18c. At this time, all rows associated with the history state have been refreshed that need to be refreshed in MROC c. Subsequently, at history state 1032, the beginning of the next memory refresh opportunity cycle d (MROC d) is illustrated, whereby the contents of the next history (NH) state have been shifted into the current history (CH) state, and the next history (NH) state values are cleared as discussed above.

In another embodiment of the present invention, a state machine is added to the RHB 904 to keep track of the current CROT (e.g. 12, 14,16, 18 of FIG. 5) and assert the DONE signal when all rows in the current CROT have been refreshed as indicated by all of the CH bits of that cluster being set (i.e. CH=1).

Therefore, it should be evident that the present invention provides an advantage over the prior art in that it allows for increased system access bandwidth for reads and writes by delaying or avoiding unneeded refresh operations onto already fresh memory rows. The increase in system access bandwidth is realized by refreshing, within a plurality of cluster refresh opportunity times (CROTs), only those rows actually in need of refreshing. Refresh time is only allocated to those memory rows or refresh groups of DRAM cells that actually need a refresh operation. This is unlike the prior which actually dedicates time to refresh each row at a specific time whether or not the refresh is needed. In other words, the prior art does not keep track of whether a recent read or write can be used to cancel an upcoming refresh of a memory row. In addition, this embodiment of FIGS. 9–13 is an improvement over the first embodiments disclosed in FIGS. 1–8 when additional system access bus bandwidth is desired.

In another embodiment of the present invention, the refresh history block 904 of FIG. 9 is configured to update the CH bits of each cluster following the refresh of all rows of the cluster instead of updating all CH bits of the entire array after the entire array is refreshed as previously discussed. In this embodiment, following the refresh of all rows associated with cluster 12 of FIG. 4, an active DONE is asserted as previously discussed but the history associated with cluster 12 is updated immediately.

For example, if cluster 12 of FIG. 4 is updated in CROT 12*b* as shown in FIG. 5 (which would be indicated when the active priority queue (PQ) bit transitions out of the cluster 12 space into a subsequent cluster as illustrated by state 1022 in FIG. 11), the active DONE signal would be generated and an update of the current history state of state 1022 for only the history bits associated with the cluster 12 would occur. In other words, the next history bits 0 through 3 after state 1022 of FIG. 12 would be updated (i.e. next history state of cluster 12 is transferred to current history state array) to reside in the current history bit locations of state 1022 in a update manner as previously discussed. After this partial update for one cluster, the next history (NH) bits for cluster 12 would be cleared after or in state 1022. By incrementally updating the individual cluster histories on a cluster-by-cluster basis rather than waiting until the end of an entire MROC as discussed previously, greater memory updating resolution is obtained.

An example of this savings can be shown by referring to state 1025 of FIG. 12. As illustrated in FIG. 12 using updating at the end of an MROC, the square bracketed system access updates that are located before the asserted PQ=1 bit position indicated in state 1024 are lost using a MROC-based update and give no performance advantage because they occurred in the current MROC, after the PQ bit has passed that location, and before the update occurred. Only system accesses occurring in locations after the PQ=1 position can offer refresh savings when updating history bits only at the end of an MROC. The present CROT-by-CROT update, as opposed to an MROC-level update, gives performance advantages since all system accesses to memory associated with all other CROTs than the currently processed CROT are changing updated data and are therefore not lost due to lack of an update. In other words, because the update can occur following each individual cluster refresh, the refresh benefit of system accesses into memory associated with history bit locations before the asserted PQ bit location are not lost due to lack of updating. As a specific example with respect to state 1025, when memory associated with the current history (CH) bits 0–9 in state 1025 is refreshed (where locations 0-9 precede the PQ=1 bit in location 9 as in state 1024), these square bracketed changes located in previously updated CROTs of the MROC would be changing updated CH information and not old information thereby resulting in the postponement of refresh operations to later MROCs.

The previous example describes an embodiment of the invention in which history bits are used with a distributed burst refresh scheme to increase overall performance of system with an embedded DRAM. In practice, however, the number of rows or refresh groups per cluster is chosen as a compromise between limiting the bandwidth devoted to the refresh activity by maintaining rapid bursting after an initial setup delay penalty has been paid, and limiting the maximum memory system response latency to a tolerable level as normal accesses are postponed until a refresh burst is concluded.

FIG. 14 illustrates yet another design consideration of the present embodiment. FIG. 14 includes Data Retention Time (DRT) interval 1401, MROCs 1420 and 1422, and CROTs 1410, 1411, 1412, 1413, 1414, 1415, and 1416. DRT 1401 starts at the beginning of CROT 1410 and ends at the end of CROT 1416. MROC 1420 starts at the beginning of CROT 1410 and ends at the beginning of CROT 1413. Similarly, MROC 1422 starts at the beginning of CROT 1413 and ends at the beginning of CROT 1416. CROTs 1410, 1413, and 1416 are all allotted to refresh the same cluster of rows or refresh groups. The following worst case scenario provides the rationale regarding the reason that DRT interval 1041 ends at the end of CROT 1416 rather than at the beginning of CROT 1416.

Suppose that for CROT 1410, the only refresh group which was indicated by the RHB 904 to be in need of refreshing was the last row or refresh group of the cluster of CROTs 1410, 1413, and 1416. As a consequence of being refreshed in CROT 1410, the last row or refresh group of the cluster of CROTs 1410, 1413, and 1416 would not be scheduled for refresh in CROT 1413. Now further suppose that all of the rows or refresh groups of cluster of CROTs 1410, 1413, and 1416 are scheduled for refresh in CROT 1416. In order that the data retention time specification for the last refresh group of the cluster of CROTs 1410, 1413, and 1416 not be violated, DRT 1401 must span from the beginning of CROT 1410 to the end of CROT 1416. Therefore, the sum of the durations MROC 1420 and MROC 1422 is somewhat less than the DRT 1401. For memory systems with large numbers of refresh groups and small clusters this difference is negligible.

In yet another embodiment of the present invention, a COHERENT REFRESH signal, as illustrated in FIG. 9, is provided to memory array tiles 902. In a design where multiple tiles 902 are used in an architecture, groups of rows of cells having the same row address in each tile are collectively referred to and controllable as a refresh group. For example, all of the rows of memory having row address 0 in each tile would be grouped into a first refresh group. Therefore, each unique row address identifies a unique refresh group and each and every memory cell in the same refresh group is refreshed in the same refresh cycle. It is important to note that other ways can be used to parse tiles and rows into various refresh groups. In this hierarchical structure, all rows in a refresh group of the memory array tiles 902 would be refreshed simultaneously in a memory refresh opportunity cycle (MROC). In other words, a first memory row in the four tiles 902 illustrated in FIG. 9 would be refreshed simultaneously during one refresh cycle.

However, during a system access (e.g., a memory read or write operation), only one of the memory array tiles 902 would be accessed. As a specific example, if a value is written to memory, this value is written to a unique memory row within a single tile but all other memory rows in the other tiles in the refresh group are not refreshed by the system access. This would result in the unselected rows in a refresh group not being coherently refreshed for system accesses. (i.e., the same row address in every tile of the refresh group would not have an identical refresh history).

In order to maintain a coherent refresh state among all the memory tiles following a system access of any kind, a coherent refresh scheme would need to be implemented. First, the system access signals (e.g., RAS, CAS, etc.) are received by the refresh history block 904. During a read or a write access of the memory array tiles, the current history bits 931 of the refresh group which contains the row being accessed are evaluated. If the current history bits 901 for the row being accessed indicate that a refresh is pending for the refresh group which contains the accessed row, the COHERENT REFRESH signal is driven active. Upon receiving the active COHERENT REFRESH signal, the memory array tiles 902 which are not currently being accessed as part of the read or write would, in response to the active COHERENT REFRESH signal, refresh the unaccessed rows associated with refresh group.

Figure 15:
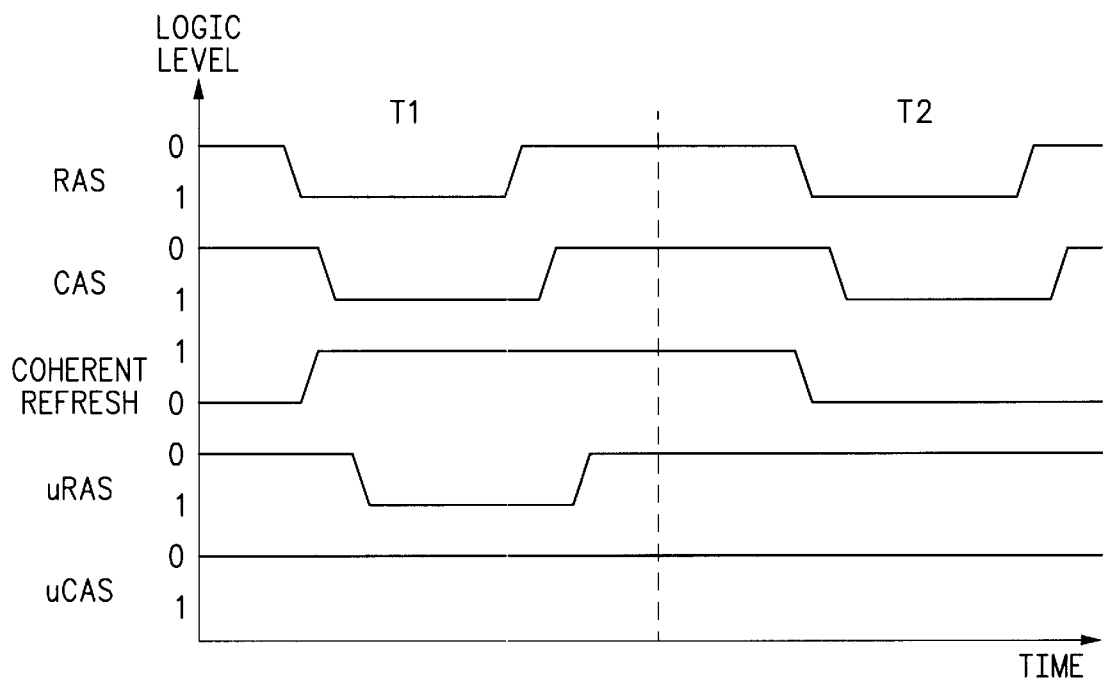
FIG. 15 illustrates, in a timing diagram, the use of RAS and CAS control signals in a coherent refresh architecture in accordance with the present invention.

This coherent refresh can best be illustrated with reference to the timing diagram of FIG. 15. FIG. 15 shows the timing associated with a tile being accessed (i.e. RAS and CAS signals of FIG. 15) and one or more tiles that are unaccessed (i.e. uRAS and uCAS signals of FIG. 15) during a read or a write. The accessed tile will see both a RAS and a CAS signal go active during the access period and the write or read will refresh this location automatically. However, the inactive tiles would not respond to the RAS or the CAS signal as illustrated in FIG. 15 when coherent refresh is not active. If the unaccessed tiles needing refresh do not recognize the RAS signal, then no refresh occurs and coherency is not maintained within a refresh group. However, assertion of the COHERENT REFRESH signal will correct this problem by causing uRAS to be asserted while keeping uCAS negated, whereby all rows in a refresh group, whether accessed or not, are maintained in an identical refresh state for refresh processing.

Specifically, if the COHERENT REFRESH signal is active and the history bits indicate that refresh is needed for this refresh group, the RAS signal would be asserted for the inactive tiles by an alternate tile decoding path to enable a RAS-only refresh whereby unaccessed rows in the refresh group are refreshed. The CAS signal for unaccessed rows would remain inactive as in a typical RAS-only refresh. If the history bits indicate no refresh of any rows in this refresh group is needed, then the unaccessed rows need not be refreshed by a RAS-only refresh whereby power may be saved by avoiding unneeded refresh operations. Therefore, the COHERENT REFRESH signal ensures that the refresh states of all the different rows across all memory tiles are identical when these rows are in the same refresh group while also ensuring that unneeded refreshing of unaccessed rows in a refresh group are avoided where possible to reduce integrated circuit (IC) power consumption.

In yet another embodiment of the present invention, the refresh history block 904 of FIG. 9 would maintain state information as to whether or not a specific row associated with the memory array tiles has been accessed for use or is an unused portion of memory. If after reset, the memory array tiles have not been written to by the system DRAM controller, no useful information is stored within those unwritten rows. Therefore, by storing access information in the refresh history block that indicates when a specific row has not been accessed following a reset, it is possible to avoid wasting time and power on refreshing unused rows of memory that do not contain useful information. In other words, coming out of reset, the refresh history block 904 would contain a separate state in a state machine or a separate bit, such as a valid bit, indicating that no row associated with that refresh group or memory row contains valid information. During the memory refresh opportunity cycles (MROCs), when a specific row or refresh group is scheduled to be refreshed, if the row or refresh group has not been written because the history bit was initialized, the refresh processing would not be engaged, therefore saving system power and time. However, once a row is written to by the system DRAM controller, the valid bit or valid state is set to be active indicating that the row or refresh group needs to be refreshed. It is important to note that this function could be programmable where a user can selectively enable or disable refreshing for portion(s) of the memory by executing an instruction or setting one or more bits in a system register. This is particularly useful in MCU applications where an MCU may contain 128K bytes of memory space and only use a small portion (e.g., 8K of memory) in one embedded application. In this manner subsequent refreshes in the manner previously discussed herein would be allowed to occur. As another example, an algorithm (e.g., a garbage collection algorithm) could monitor the various memory rows and selectively clear valid bits to release memory where appropriate to save power and refresh processing time.

It would be understood by one skilled in the art that separate register bits could be used to store the valid information or it could be part of a state machine which would include the next history information, the current history information, as well as the valid history information.

Although the invention has been described and illustrated with reference to specific embodiments, it is not intended that the invention be limited to those illustrative embodiments. Although embedded DRAM is discussed herein, the method and apparatus taught herein may be used for any other DRAM application and/or any other type of memory which needs periodic refreshing. Therefore, it is intended that this invention encompass all of the variations and modifications as fall within the scope of the appended claims.

What is claimed is:

1. An apparatus comprising:
a plurality of memory cells wherein the plurality of memory cells have a data retention time; and
refresh circuitry coupled to the plurality of memory cells wherein the refresh circuitry performs a plurality of freshness evaluation cycles within a time period equal to or less than the data retention time, a current freshness evaluation cycle in the plurality of freshness evaluation cycles using at least one history bit to determine whether a refresh of at least one memory cell in the plurality of memory cells is to occur in response to the current freshness evaluation cycle or be postponed until a later freshness evaluation cycle.

2. The apparatus of claim 1 wherein the plurality of memory cells are configured into memory rows wherein each memory row contains a unique set of memory cells selected from the plurality of memory cells, the at least one history bit being a plurality of history bits wherein the plurality of history bits track refresh history for each memory row.

3. The apparatus of claim 2 wherein the plurality of history bits includes at least one history bit specifically associated with each memory row.

4. The apparatus of claim 1 wherein the plurality of memory cells are arranged in memory rows wherein the memory rows are arranged into a plurality of refresh groups wherein at least one history bit is maintained for each one of the plurality of refresh groups.

5. The apparatus of claim 1 wherein the plurality of memory cells are arranged into groups of memory cells that define memory tiles, wherein memory rows in the memory tiles are grouped into memory banks, wherein one memory row from a plurality of memory banks are grouped together to form a refresh group, the refresh group being specifically associated with at least one unique history bit.

6. The apparatus of claim 1 wherein the plurality of memory cells are configured into a plurality of memory rows and the at least one history bit is a plurality of history bits, wherein one history bit is located adjacent to each memory row in the plurality of memory rows.

7. The apparatus of claim 1 wherein the plurality of memory cells are configured into a plurality of memory rows and the at least one history bit is a plurality of history bits, wherein the plurality of history bits are located in close proximity to each other in a refresh history block (RHB) separate from the plurality of memory rows.

8. The apparatus of claim 1 wherein the at least one history bit is a logic value stored in a volatile static random access storage element.

9. The apparatus of claim 1 wherein the plurality of memory cells are DRAM cells having a first data retention time and the at least one history bit is a logic value stored in a dynamic storage device where the dynamic storage device has a second data retention time greater than the first data retention time.

10. The apparatus of claim 1 wherein the plurality of memory cells are DRAM cells and wherein the plurality of memory cells are integrated onto a single integrated circuit (IC) die that also contains logic functions that access information in the plurality of memory cells.

11. The apparatus of claim 1 wherein the plurality of memory cells are arranged in memory rows wherein the memory rows are arranged into a plurality of refresh groups wherein one of the memory rows in one refresh group is refreshed via a systems access operation and all remaining non-accessed memory rows in the refresh group are refreshed using a RAS-only refresh operation.

12. The apparatus of claim 1 wherein the at least one history bit is a plurality of history bits comprising:
  a plurality of current history bits to contain refresh information pertaining to a current freshness evaluation cycle; and
  a plurality of next history bits to contain information pertaining to a next freshness evaluation cycle which is to follow the current freshness evaluation cycle.

13. The apparatus of claim 1 wherein a priority chain circuit is used to process the at least one history bits to ensure that memory cells associated with history bits that indicate no refresh is needed are postponed for refresh thereby additional memory access bandwidth is provided to a CPU.

14. The apparatus of claim 13, wherein the priority chain circuit has an output that is asserted when all history bits indicate no further refresh is needed by the memory cells associated with the history bit, therefore allowing the system to use the unneeded cycles.

15. The apparatus of claim 1 wherein the at least one history bit is a plurality of history bits and the plurality of memory cells are configured into a plurality of refresh groups, each refresh group in the plurality of refresh groups having at least two history bits associated therewith wherein these two history bits for each refresh group are influenced by a state machine circuit, the state machine circuit selectively creating at least four states, wherein four of the at least four states indicate one of either: (1) that the refresh group is unused memory; (2) that the refresh group needs refreshing; (3) that the refresh group is fully refreshed; or (4) that the refresh group is partially fresh such that a currently pending refresh is postponed.

16. The apparatus of claim 1 wherein the plurality of memory cells are arranged into a plurality of refresh groups wherein each refresh group has an associated array of current history bits and an associated array of next history bits coupled to an associated priority circuit, the apparatus comprising:
  a circular scan chain containing a number of bits equal to the number of refresh groups wherein each bit in the circular scan chain is associated with one unique refresh group, the bit associated with each refresh group being selected by shifting an active signal into the bit whereby the active signal enables controller access to the array of current history bits, the associated array of next history bits, and the associated priority circuit to perform refresh operations only on a refresh group identified by the bit containing the active signal.

17. A method for refreshing memory having a plurality of memory cells configured into memory rows, the method comprising the steps of:
  initializing a plurality of history bits associated with the memory rows of memory cells, one history bit in the plurality of history bits is associated with one refresh group of memory cells;
  performing both system accesses and refresh operations to the plurality of memory cells wherein these system accesses and refresh operations are allowed to selectively affect a state of the plurality of history bits, the one history bit being asserted to indicate a refresh state of the refresh group when: (1) the refresh group is accessed by a system access or (2) the refresh group is refreshed by a refresh operation and the one history bit is deasserted, and the one history bit being deasserted when the refresh group is refreshed by a refresh operation and the one history bit is asserted and
  selectively inhibiting certain refresh operations based upon the state of the plurality of history bits.

18. A method for refreshing memory having a plurality of memory cells configured into memory rows, a number of the plurality of memory cells are configured into a refresh group, the method comprising the steps of:
  initializing a plurality of history bits associated with the memory rows of memory cells, the plurality of history bits containing current history bits and next history bits wherein one current history bit and one next bit are associated with the refresh group;
  performing both system accesses and refresh operations to the plurality of memory cells wherein these system accesses and refresh operations are allowed to selectively affect a state of the plurality of history bits, the one current history bit and the one next bit both being asserted when the refresh group is refreshed and the current history bit is deasserted, and the one current history bit being asserted when a system access is made to the refresh group; and
  selectively inhibiting certain refresh operations based upon the state of the plurality of history bits.

19. A method for refreshing memory having a plurality of memory cells configured into memory rows, a number of the plurality of memory cells are configured into a refresh group, the method comprising the steps of:
  initializing a plurality of history bits associated with the memory rows of memory cells, the plurality of history bits containing current history bits and next history bits wherein one current history bit and one next history bit are associated with the refresh group;
  performing both system accesses and refresh operations to the plurality of memory cells wherein these system accesses and refresh operations are allowed to selectively affect a state of the plurality of history bits, the one current history bit storing information for a current refresh cycle and the next history bit storing information for a next refresh cycle wherein the one next history bit is shifted into the one current history bit after completion of the current refresh cycle; and selectively inhibiting certain refresh operations based upon the state of the plurality of history bits.

20. A method for refreshing memory having a plurality of memory cells configured into memory rows, a number of the plurality of memory cells are configured into a refresh group, the method comprising the steps of:

initializing a plurality of history bits associated with the memory rows of memory cells at least two history bits within the plurality of history bits associated with the refresh group, the at least two history bits being controlled by a state machine wherein the at least two history bits are able to indicate any one of either: (1) that the refresh group is unused memory; (2) that the refresh group needs refreshing; (3) that the refresh group is fully refreshed; or (4) that the refresh group is partially fresh such that a currently pending refresh is postponed;

performing both system accesses and refresh operations to the plurality of memory cells wherein these system accesses and refresh operations are allowed to selectively affect a state of the plurality of history bits; and selectively inhibiting certain refresh operation based upon the state of the plurality of history bits.

21. An apparatus comprising:

a system DRAM controller having a first output for providing control signals, a second output for providing a system access row address, and a third output for providing a last refresh address;

a plurality of DRAM memory arrays coupled to the first and second outputs of the system DRAM controller; and a refresh history block coupled to the first, second, and third outputs of the system DRAM controller, the refresh history block comprising:

a row decoder for processing information from at least one of the second or third outputs of the system DRAM controller and providing output decode signals;

a plurality of current history bits coupled to the output decode signals for storing current DRAM refresh information pertaining to a current freshness evaluation cycle;

a plurality of next history bits coupled to the output decode signals for storing next DRAM refresh information pertaining to a next freshness evaluation cycle which is to follow a current DRAM freshness evaluation cycle; and output circuitry for providing a memory refresh address to the plurality of DRAM memory arrays in response to contents of the plurality of current history bits.

22. The apparatus of claim 21 wherein the second and third outputs are a same physical output connection which are time multiplexed between the system access row address and the last refresh address.

23. The apparatus of claim 21 wherein the plurality of next history bits are copied to the plurality of current history bits, wherein the plurality of next history bits are then cleared in response to an assertion of an update signal.

24. The apparatus of claim 21 wherein the output circuitry comprises a priority chain which provides outputs to a plurality of input signals of a row encoder, the outputs of the priority chain being a function of a state of the plurality of current refresh history bits.

25. The apparatus of claim 21 wherein the row decoder selects one of the current history bits in the plurality of current history bits to be marked as fresh during a system access.

26. The apparatus of claim 21 wherein the row decoder processes a last refresh row address input to select a range of current history bits in the plurality of current history bits and a range of next history bits in the plurality of next history bits which are associated with a DRAM memory array from the plurality of DRAM memory arrays, and performing selective refresh operations on the DRAM memory array using the range of current history bits and the range of next history bits.

27. A method for refreshing memory, the method comprising the steps of:

(a) providing a plurality of memory cells configured into refresh groups;

(b) initializing a plurality of current history bits and a plurality of next history bits, the plurality of current history bits and the plurality of next history bits being configured to correspond to the refresh groups;

(c) providing a last refresh row address to a refresh history block wherein the last refresh row address defines a range of current history bits which are to be evaluated for refreshing;

(d) scanning the range of current history bits and performing a refresh operation only on those refresh groups associated with current history bits, in the range of current history bits, that indicate a stale state, and changing a state of the current history bits which are associated with refresh groups that were refreshed;

(e) repeating steps (c) through (e) until all current history bits in the range of current history bits are evaluated;

(f) transferring respective next history bits to respective current history bits; and (g) repeating steps (c) through (g) until refresh operations are complete.

28. A method for refreshing memory, the method comprising the steps of:

(a) providing a plurality of memory cells configured into refresh groups;

(b) initializing a plurality of current history bits and a plurality of next history bits, the plurality of current history bits and the plurality of next history bits being configured to correspond to the refresh groups;

(c) providing a last refresh row address to a refresh history block wherein the last refresh row address defines a range of current history bits which are to be evaluated for refreshing;

(d) evaluating the range of current history bits and performing a refresh operation only on those refresh groups associated with current history bits, in the range of current history bits, that indicate a stale state, and changing a state of the current history bits which are associated with refresh groups that were refreshed;

(e) transferring respective next history bits that were processed in steps (c) through (d) to respective current history bits for the range of current history bits;

(f) repeating steps (c) through (f) until all current history bits in the plurality of current history bits are evaluated; and (g) repeating steps (c) through (g) to perform another freshness evaluation cycle.

29. An apparatus comprising:
- a plurality of rows of memory cells organized as a plurality of refresh groups wherein each refresh group in the plurality of refresh groups contains at least two unique rows of memory cells;
- a plurality of history bits for each refresh group wherein at least one unique history bit in the plurality of history bits is associated with a unique one of the refresh groups;
- a plurality of priority circuits wherein each priority circuit is associated with a unique one of the plurality of refresh groups; and
- a circular-coupled storage chain having a number of bit locations equal to the number of refresh groups, each bit in the circular-coupled storage chain enabling refresh operation on one of the plurality of refresh groups when enabled.

30. An apparatus comprising:
- a memory array configured into a plurality of memory tiles, each memory tile in the plurality of memory tiles containing N rows of memory cells where N is a finite positive integer, each one of the N rows being associated together into refresh groups where each refresh group contains M memory rows where M is a finite positive integer;
- a plurality of history bit groups, wherein each of the history bit groups in the plurality of history bit groups contain at least one history bit that is associated with a unique one refresh group; and
- memory access and refresh circuitry coupled to the plurality of history bit groups and the memory array, the memory access and refresh circuitry system accessing one of the M memory rows in a selected refresh group to result in an accessed row of memory in the selected refresh group and a plurality of unaccessed rows of memory in the selected refresh group, wherein the memory access and refresh circuitry evaluating the plurality of history bit groups to determine whether the unaccessed rows of memory in the selected refresh group should be refreshed or is in no current need for refreshing.

31. A method for refreshing memory the method comprising the steps of:
- (a) providing a memory array;
- (b) initializing history bits to indicate that all memory within the memory array is initially unused, the history bits keeping track of at least four states of a memory cell within the memory array during operation of the memory cell, the at least four states comprising: (1) an unused memory state which indicates that the memory cell is currently not storing valid data; (2) a fresh memory state wherein the memory cell need not be refreshed for a first period of time; (3) a half fresh memory state wherein the memory cell needs to be refreshed within a second period of time that is less than the first period of time; and (4) a stale memory state which indicates that the memory cells needs to be refreshed at a next refresh opportunity;
- (c) using a portion of the memory array to result in a used portion of the memory array and an unused portion of the memory that are identified via the history bits; and
- (d) performing refresh processing only on the used portion of the memory array while not performing any refresh processing on the unused portion of the memory array as indicated by the history bits.

* * * * *